US012620770B2

(12) United States Patent
Kikuchi et al.

(10) Patent No.: US 12,620,770 B2
(45) Date of Patent: May 5, 2026

(54) SEMICONDUCTOR LASER ELEMENT AND METHOD OF PRODUCING SEMICONDUCTOR LASER ELEMENT

(71) Applicant: SONY GROUP CORPORATION, Tokyo (JP)

(72) Inventors: Yuichiro Kikuchi, Kumamoto (JP); Yukio Hoshina, Kumamoto (JP); Hideki Watanabe, Kumamoto (JP); Yuta Isozaki, Kumamoto (JP); Hidekazu Kawanishi, Kumamoto (JP); Masahiro Murayama, Tokyo (JP); Takashi Sugiyama, Kumamoto (JP)

(73) Assignee: SONY GROUP CORPORATION, Tokyo (JP)

( * ) Notice: Subject to any disclaimer, the term of this patent is extended or adjusted under 35 U.S.C. 154(b) by 736 days.

(21) Appl. No.: 17/998,359

(22) PCT Filed: May 13, 2021

(86) PCT No.: PCT/JP2021/018162
§ 371 (c)(1),
(2) Date: Nov. 10, 2022

(87) PCT Pub. No.: WO2021/235304
PCT Pub. Date: Nov. 25, 2021

(65) Prior Publication Data
US 2023/0187897 A1    Jun. 15, 2023

(30) Foreign Application Priority Data
May 21, 2020    (JP) ................................. 2020-088808

(51) Int. Cl.
*H01S 5/22*        (2006.01)
*H01S 5/02*        (2006.01)
(Continued)

(52) U.S. Cl.
CPC .............. *H01S 5/0206* (2013.01); *H01S 5/22* (2013.01); *H01S 5/34333* (2013.01); *H01S 5/34386* (2013.01); *H01S 5/0234* (2021.01)

(58) Field of Classification Search
CPC ...... H01S 5/0206; H01S 5/22; H01S 5/34333; H01S 5/34386; H01S 5/0234;
(Continued)

(56) References Cited

U.S. PATENT DOCUMENTS

2007/0292979 A1*  12/2007  Hata ................. H01L 21/02639
257/E21.127
2010/0193833 A1*   8/2010  Miyake ............... H01S 5/32025
257/E29.089

FOREIGN PATENT DOCUMENTS

JP        2004-023050 A      1/2004
JP        2004-260152 A      9/2004
(Continued)

OTHER PUBLICATIONS

International Search Report and Written Opinion of PCT Application No. PCT/JP2021/018162, issued on Jun. 8, 2021, 09 pages of ISRWO.

*Primary Examiner* — Yuanda Zhang
(74) *Attorney, Agent, or Firm* — CHIP LAW GROUP

(57) ABSTRACT

Provided is a semiconductor laser element according to the present technology that includes a stacked body. The stacked body includes a substrate, an n-type semiconductor layer that is formed on the substrate, is formed of an n-type semiconductor material, and has a core that is a defect concentration region, an active layer that is formed on the n-type semiconductor layer, and a p-type semiconductor layer that is formed on the active layer and is formed of a p-type semiconductor material, and has a recessed portion formed from a surface of the p-type semiconductor layer to (Continued)

have a depth reaching the core and an ion implantation region that is formed by implanting ions into a region including the core.

7 Claims, 26 Drawing Sheets

(51) Int. Cl.
   *H01S 5/343*         (2006.01)
   *H01S 5/0234*      (2021.01)
(58) Field of Classification Search
   CPC ............. H01S 5/2086; H01S 5/320225; H01S
                   5/2063; H01S 5/2222; H01S 2301/176
   See application file for complete search history.

(56)                References Cited

FOREIGN PATENT DOCUMENTS

| JP | 2005-311309 A | 11/2005 |
|----|---------------|---------|
| JP | 2006-203171 A | 8/2006 |
| JP | 2008-141180 A | 6/2008 |
| JP | 2011-151424 A | 8/2011 |

* cited by examiner

150

M

104c

103c

102c

101c

104

103

102

101

Z

X

Y

SEMICONDUCTOR LASER ELEMENT AND METHOD OF PRODUCING SEMICONDUCTOR LASER ELEMENT

CROSS REFERENCE TO RELATED APPLICATIONS

This application is a U.S. National Phase of International Patent Application No. PCT/JP2021/018162 filed on May 13, 2021, which claims priority benefit of Japanese Patent Application No. JP 2020-088808 filed in the Japan Patent Office on May 21, 2020. Each of the above-referenced applications is hereby incorporated herein by reference in its entirety.

TECHNICAL FIELD

The present technology relates to a semiconductor laser element having a ridge waveguide structure and a method of producing the semiconductor laser element.

BACKGROUND ART

A semiconductor laser element has a problem that it is difficult to obtain a high output due to heat generation. As a solution to the problem, junction-down mounting that joins a surface of the semiconductor laser element on the side closer to the light-emitting portion to a member such as a heat sink with high heat dissipation is performed. However, in the junction-down mounting, there is a possibility that solder creeps up to reach the side surface of the element during mounting, which causes current leakage. Meanwhile, for example, Patent Literature 1 discloses a nitride semiconductor laser element having a structure in which a groove is formed on the side surface of the element and part of the bottom surface of the element and the side surface of the element are covered by an insulating protective film.

CITATION LIST

Patent Literature

Patent Literature 1: Japanese Patent Application Laid-open No. 2005-311309

DISCLOSURE OF INVENTION

Technical Problem

Here, a c-plane GaN substrate that is often used as a substrate of a semiconductor laser element has a region called a core. The core is a region in which crystal defects are concentrated and no continuity in crystal structure is provided with the surrounding region, and the surface shape of the core varies. For this reason, there is a possibility that the coverage is incomplete even if the surface of the element is covered by an insulating protective film as described in Patent Literature 1, and current leakage cannot be prevented.

In view of the circumstances as described above, it is an object of the present technology to provide a semiconductor laser element capable of preventing current leakage in junction-down mounting and a method of producing the semiconductor laser element.

Solution to Problem

In order to achieve the above-mentioned object, a semiconductor laser element according to an embodiment of the present technology includes: a stacked body.

The stacked body includes a substrate, an n-type semiconductor layer that is formed on the substrate, is formed of an n-type semiconductor material, and has a core that is a defect concentration region, an active layer that is formed on the n-type semiconductor layer, and a p-type semiconductor layer that is formed on the active layer and is formed of a p-type semiconductor material, and has a recessed portion formed from a surface of the p-type semiconductor layer to have a depth reaching the core and an ion implantation region that is formed by implanting ions into a region including the core.

In accordance with this configuration, since the recessed portion having a depth reaching the core is formed and the ion implantation region having a high resistance is formed in a region including the core, it is possible to prevent current leakage due to contact of solder to the core.

The stacked body may have a side surface including an end surface of the n-type semiconductor layer, the core may be exposed to the side surface, and the recessed portion may be provided between the surface and the side surface to separate the side surface from the surface.

A ridge portion that extends in a direction parallel to the surface may be provided in the p-type semiconductor layer, and the recessed portion may extend in a direction parallel to the ridge portion.

The semiconductor laser element may further include an insulation layer formed on the surface and an inner peripheral surface of the recessed portion, in which the ion implantation region may be covered by the insulation layer.

The substrate may be a c-plane GaN substrate, the c-plane GaN substrate being a substrate that is formed of n-type GaN and has a main surface parallel to a c-plane of a GaN crystal, and the n-type semiconductor layer, the active layer, and the p-type semiconductor layer may be formed by crystal growth on the c-plane GaN substrate.

The ions may be boron ions, nitrogen ions, or protons, and a dose amount of the ions may be $2 \times 10^{13}$ cm$^{-2}$ or more and $2 \times 10^{15}$ cm$^{-2}$ or less.

In order to achieve the above-mentioned object, a method of producing a semiconductor laser element according to an embodiment of the present technology includes: preparing a stacked body that includes a substrate, an n-type semiconductor layer that is formed on the substrate, is formed of an n-type semiconductor material, and has a core that is a defect concentration region, an active layer that is formed on the n-type semiconductor layer, and a p-type semiconductor layer that is formed on the active layer and is formed of a p-type semiconductor material;

forming, by etching, a recessed portion formed from a surface of the p-type semiconductor layer to have a depth reaching the core; and Implanting ions into a region of the stacked body including the core.

MODE(S) FOR CARRYING OUT THE INVENTION

A semiconductor laser element according to an embodiment of the present technology will be described.

[Structure of Semiconductor Laser Element]

Figure 1:
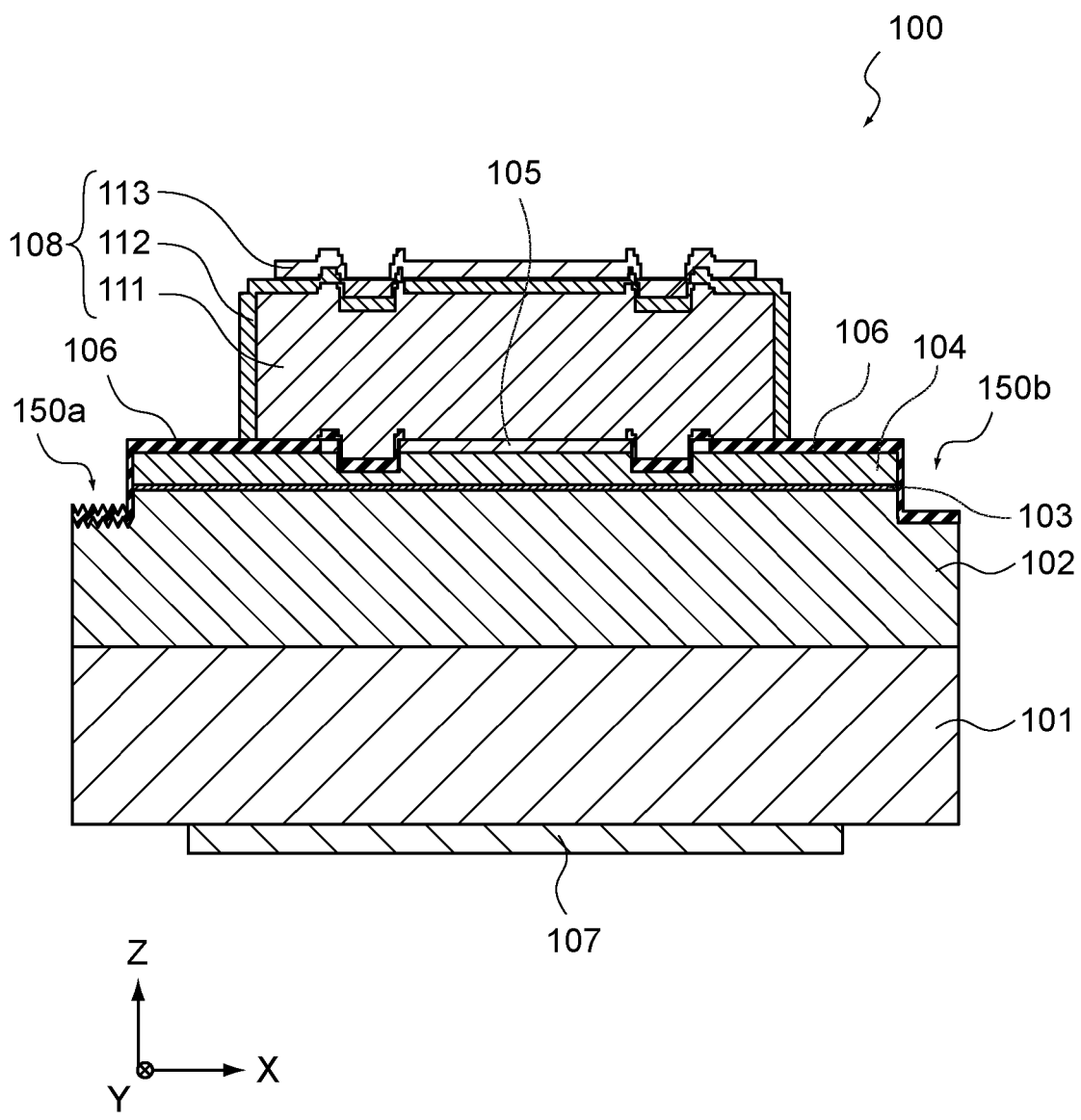
FIG. 1 is a cross-sectional view of a semiconductor laser element according to an embodiment of the present technology.
Figure 2:
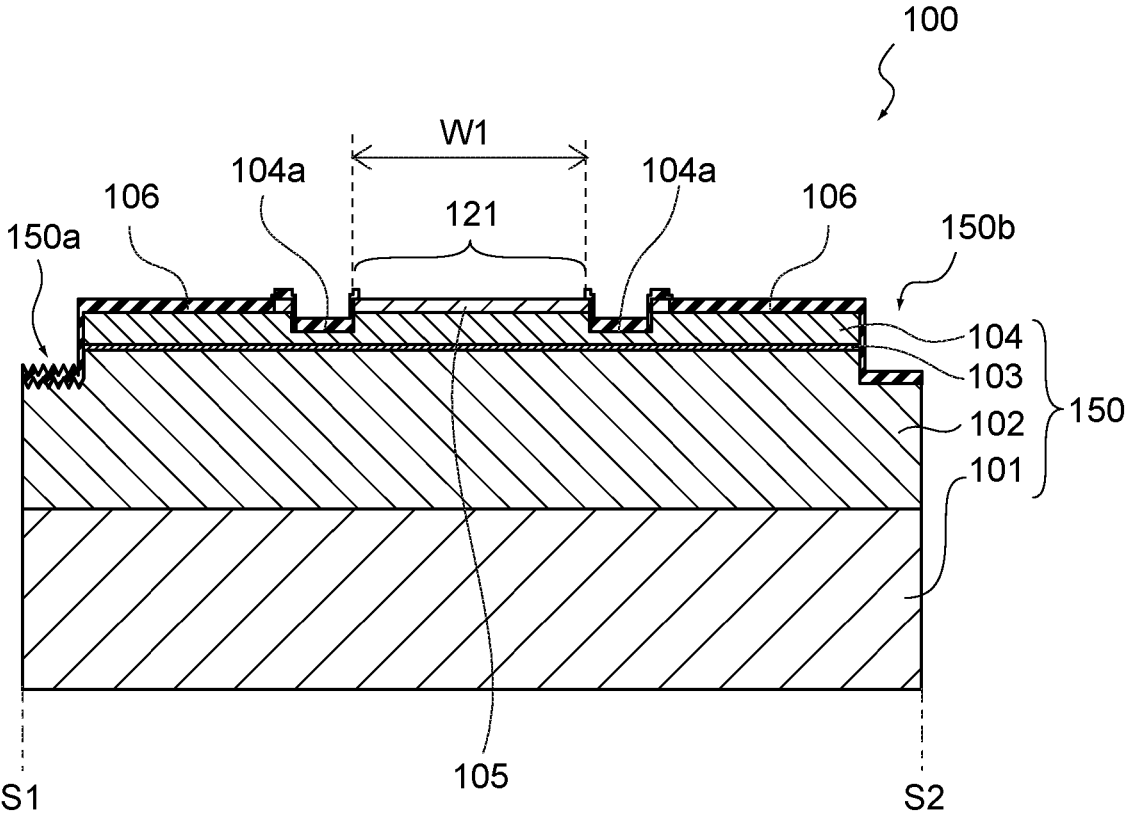
FIG. 2 is a cross-sectional view of a partial configuration of the semiconductor laser element.
Figure 2:
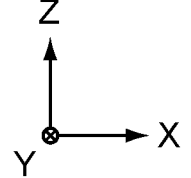
Figure 3:
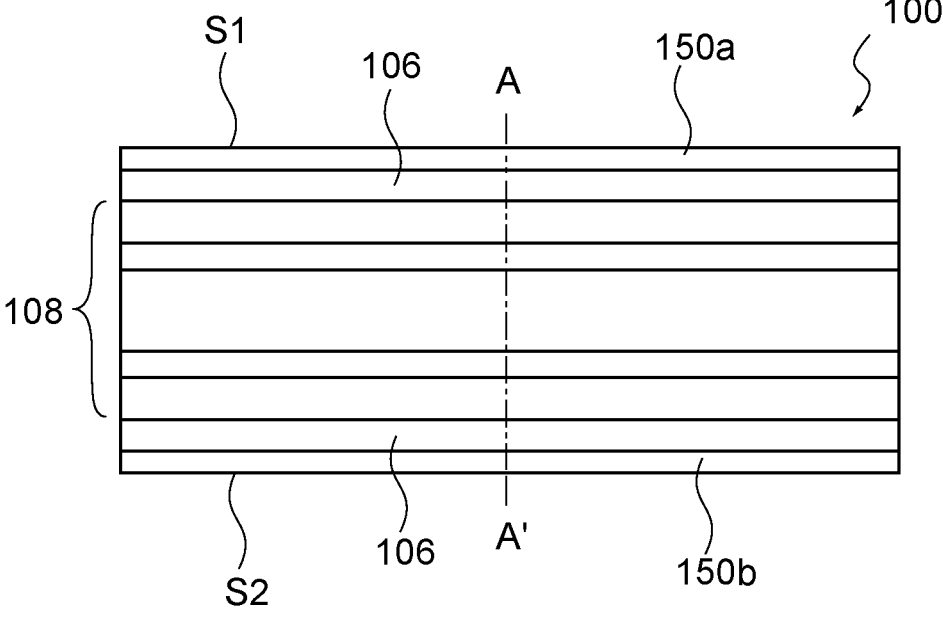
FIG. 3 is a plan view of a partial configuration of the semiconductor laser element.
Figure 3:
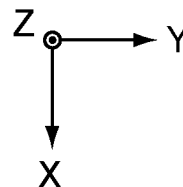

FIG. 1 is a cross-sectional view of a semiconductor laser element 100 according to this embodiment and FIG. 2 is a cross-sectional view of a partial configuration of the semiconductor laser element 100. FIG. 3 is a plan view of the semiconductor laser element 100, and FIG. 1 and FIG. 2 are each a cross-sectional view taken along the line A-A' in FIG. 3. Note that in the drawings of the present disclosure, the stacking direction of respective layers is defined as a Z direction, one direction orthogonal to the Z direction is defined as an X direction, and a direction orthogonal to the X direction and the Z direction is defined as the Y direction. That is, a layer surface direction of the respective layers is parallel to the X-Y plane.

As shown in FIG. 1 and FIG. 2, the semiconductor laser element 100 includes a substrate 101, an n-type semiconductor layer 102, an active layer 103, a p-type semiconductor layer 104, a transparent conductive film 105, an insulation layer 106, an n-electrode 107, and a p-electrode 108.

The substrate 101 supports the respective layers of the semiconductor laser element 100. The substrate 101 can be a c-plane GaN substrate that is formed of n-type GaN and has a main surface parallel to the c-plane of a GaN crystal.

The n-type semiconductor layer 102 is formed of an n-type semiconductor material and is formed on the substrate 101. The n-type semiconductor layer 102 is formed of n-type GaN and can include an n-type cladding layer and an n-type guide layer in order from the side of the substrate 101.

The active layer 103 is formed on the n-type semiconductor layer 102 and is sandwiched between the n-type semiconductor layer 102 and the p-type semiconductor layer 104. The active layer 103 emits light by recombination of holes flowing from the p-type semiconductor layer 104 and electrons flowing from the n-type semiconductor layer 102. The active layer 103 has, for example, a multi-quantum well structure in which a quantum well layer and a barrier layer are alternately stacked to form a large number of layers, and the quantum well layer and the barrier layer can be formed of, for example, InGaN having different compositions. Further, the active layer 103 may include a single semiconductor layer or have a single quantum well structure.

The p-type semiconductor layer 104 is formed of a p-type semiconductor material and is formed on the active layer 103. The p-type semiconductor layer 104 is formed of p-type GaN and can include a p-type guide layer, a p-cladding layer, and a contact layer in order from the side of the active layer 103.

Further, as shown in FIG. 2, a ridge portion 121 is formed in the p-type semiconductor layer 104. The ridge portion 121 is a projecting portion between groove portions 104a provided in the p-type semiconductor layer 104 and extends in the longitudinal direction (Y direction) of the semiconductor laser element 100. A width W1 of the ridge portion 121 can be set to 0.5 μm or more and 100 μm or less.

The n-type semiconductor layer 102, the active layer 103, and the p-type semiconductor layer 104 are formed on the substrate 101 by crystal growth. Hereinafter, a stacked body obtained by stacking the substrate 101, the n-type semiconductor layer 102, the active layer 103, and the p-type semiconductor layer 104 will be referred to as a stacked body 150. As shown in FIG. 2, one side surface of the stacked body 150 in the lateral direction (X direction) will be referred to as a side surface S1 and the side surface on the side opposite thereto will be referred to as a side surface S2. The side surface S1 and the side surface S2 include end surfaces of the substrate 101 and the n-type semiconductor layer 102.

The transparent conductive film 105 is formed on the p-type semiconductor layer 104 in the ridge portion 121 and makes the current flowing from the p-electrode 108 to the p-type semiconductor layer 104 uniform. The transparent conductive film 105 is formed of ITO (Indium Tin Oxide), ITiO (Indium Titanium Oxide), AZO ($Al_2O_3$—ZnO), IGZO (InGaZnOx), or the like. The insulation layer 106 is formed on the p-type semiconductor layer 104 excluding the ridge portion 121 and on the n-type semiconductor layer 102 in the vicinity of the side surface S1 and the side surface S2. The insulation layer 106 is formed of $SiO_2$, SiN, $Al_2O_3$, or the like.

The n-electrode 107 is formed on the surface of the substrate 101 on the side opposite to the n-type semiconductor layer 102 and is electrically connected to the n-type semiconductor layer 102 via the substrate 101. The p-electrode 108 is stacked on the transparent conductive film 105 and the insulation layer 106 and is electrically connected to the p-type semiconductor layer 104 via the transparent conductive film 105.

As shown in FIG. 1, the p-electrode 108 can include a pad metal layer 111, a barrier metal layer 112, and a bonding metal layer 113. These layers are stacked in the order of the pad metal layer 111, the barrier metal layer 112, and the bonding metal layer 113 from the side of the transparent conductive film 105 and the insulation layer 106.

[Regarding Core]

Figure 4:
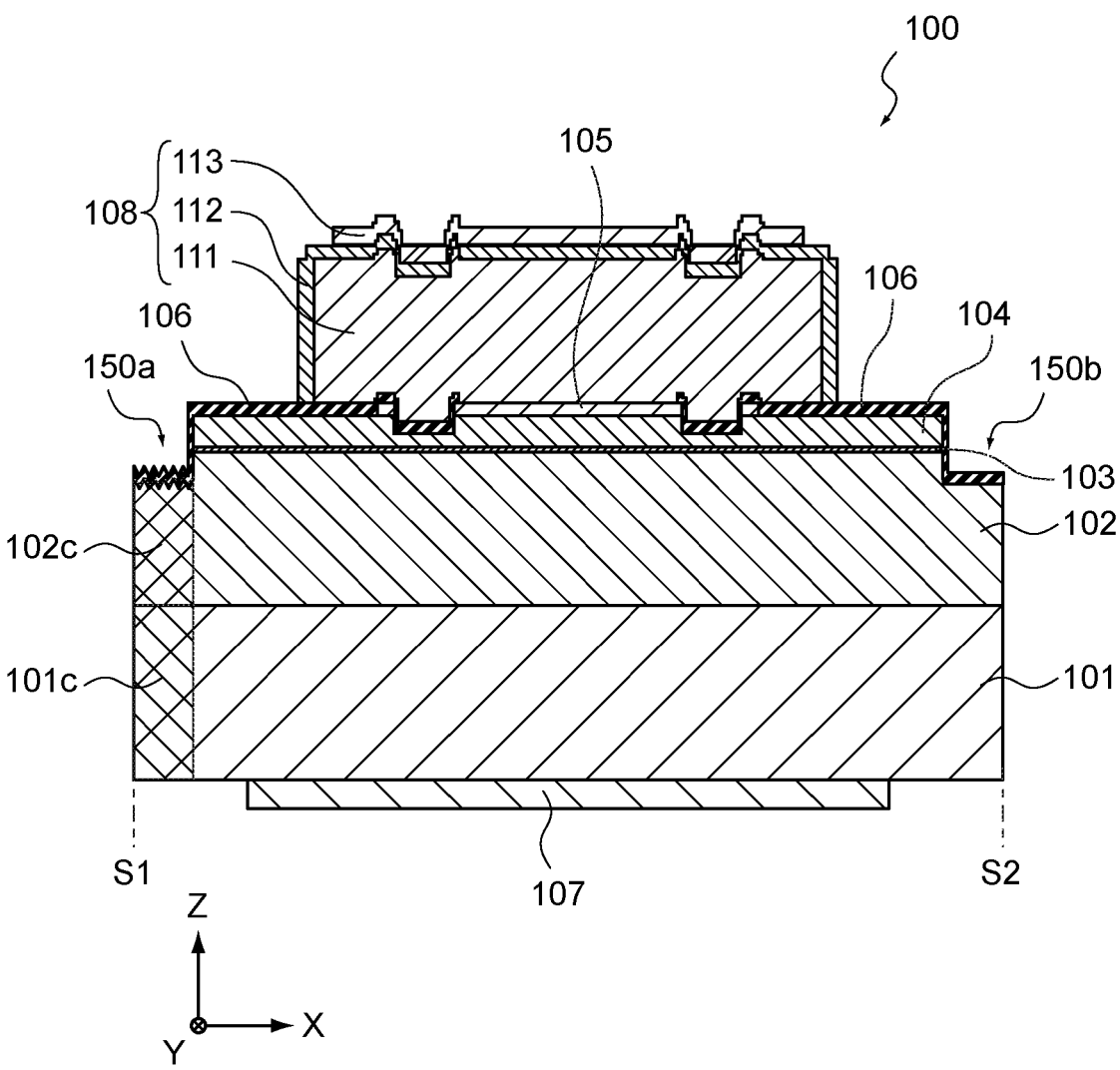
FIG. 4 is a cross-sectional view showing a core of the semiconductor laser element.
Figure 5:
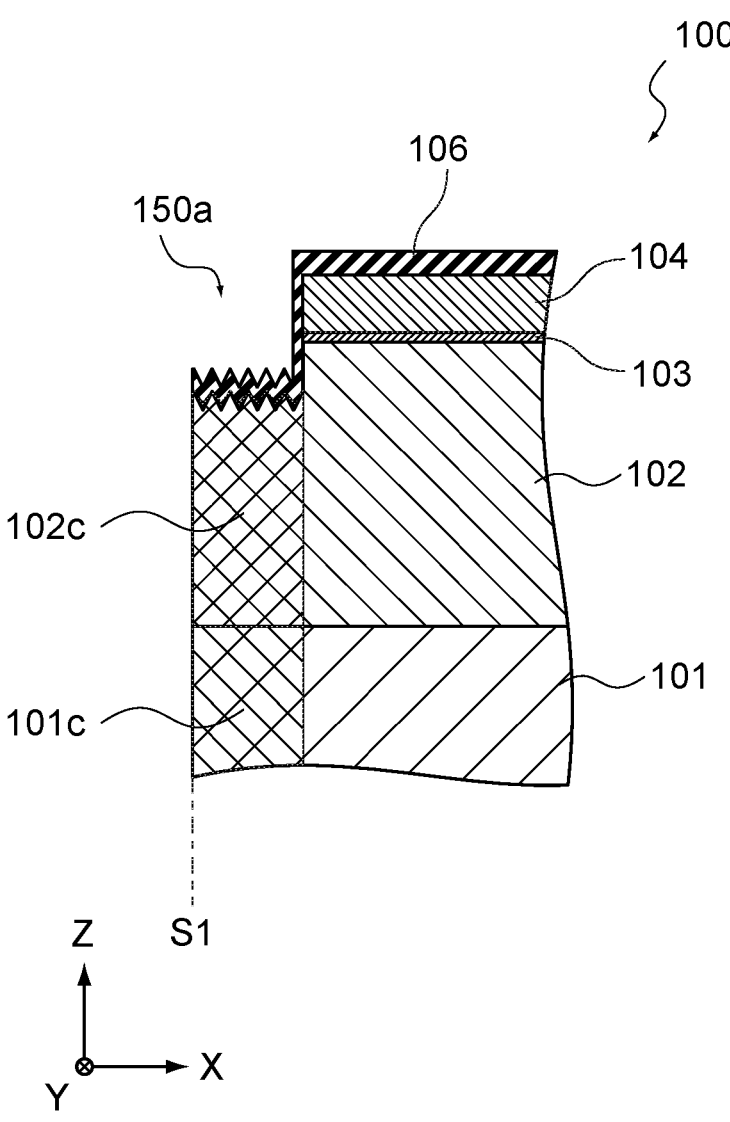
FIG. 5 is an enlarged cross-sectional view showing the core of the semiconductor laser element.
Figure 6:
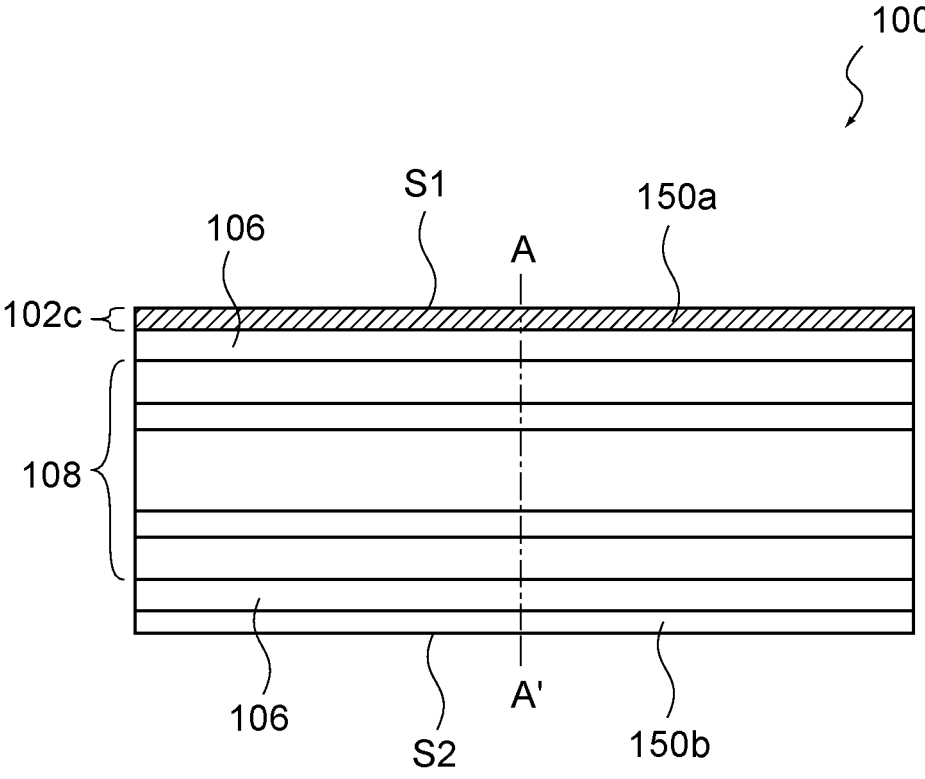
FIG. 6 is a plan view showing the core of the semiconductor laser element.
Figure 6:
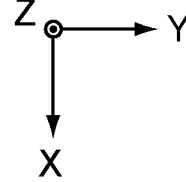

A "core" is provided in each of the substrate 101 and the n-type semiconductor layer 102. FIG. 4 is a cross-sectional view of the semiconductor laser element 100 showing the position of the core, and FIG. 5 is an enlarged view of FIG. 4. FIG. 6 is a plan view of the semiconductor laser element 100 showing the position of the core. FIG. 4 and FIG. 5 are each a cross-sectional view taken along the line A-A' in FIG. 6. The core is a characteristic structure of a c-plane GaN substrate and is a region where crestal defects are concentrated. Since the core affects light emission characteristics, a semiconductor laser element is generally provided such that a light-emitting region is separated from the core.

As shown in FIG. 4 to FIG. 6, a core 101c is present in the vicinity of the side surface S1 of the substrate 101 and the core 101c is exposed to the side surface S1. Further, also in the n-type semiconductor layer 102, a core 102c is present above the core 101c and the core 102c is exposed to the side surface S1. This is because the n-type semiconductor layer 102 is stacked on the substrate 101 by crystal growth as will be described below and a region of the n-type semiconductor layer 102 formed on the core 101c inherits the crystal structure of the core 101c. Since the core 101c and the core 102c have variations in surface shape, the insulation layer 106 on the core 102c is formed to have a recessed and projecting shape as shown in FIG. 5.

Figure 7:
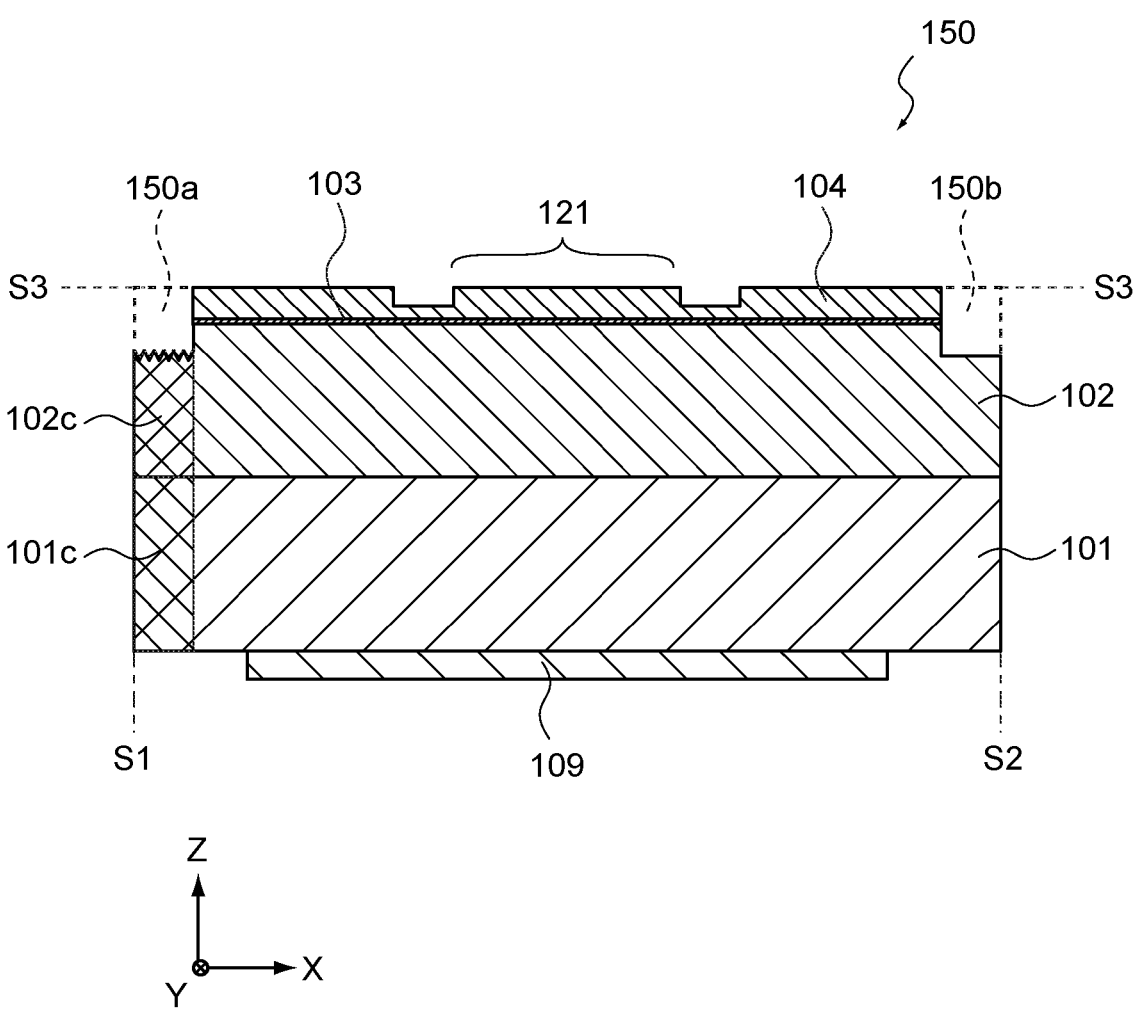
FIG. 7 is a cross-sectional view showing a recessed portion of the semiconductor laser element.
Figure 8:
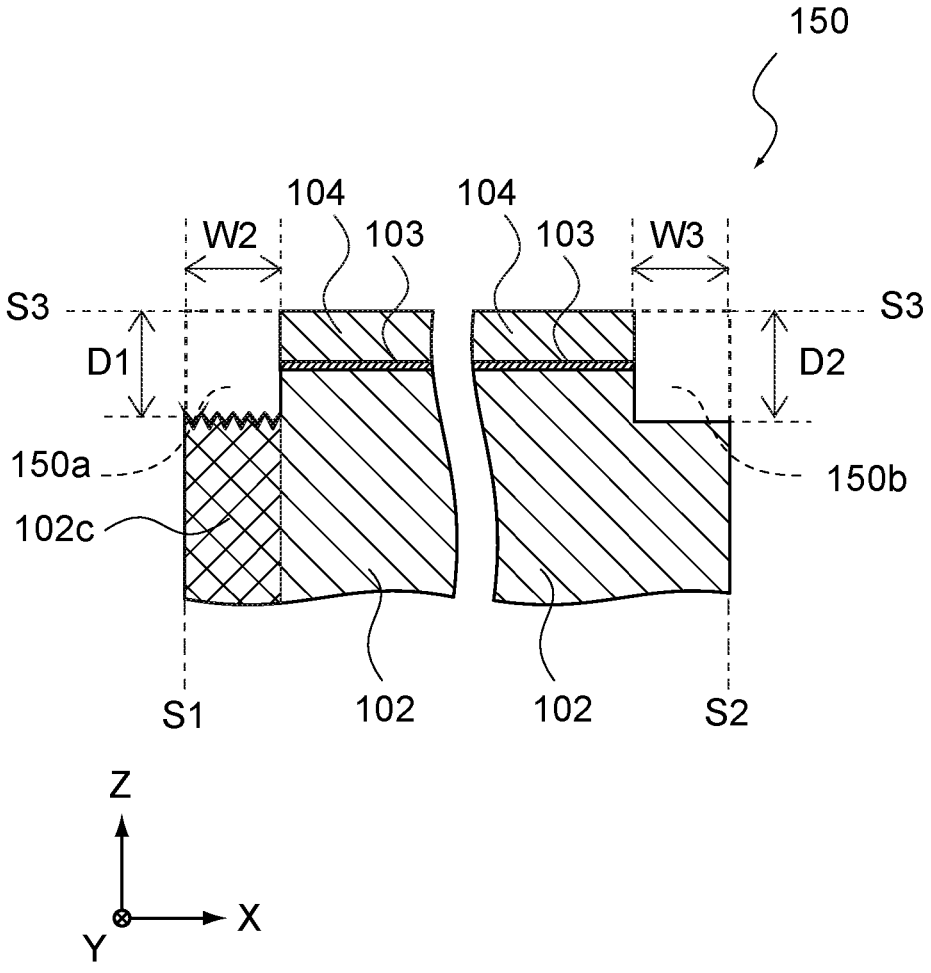
FIG. 8 is an enlarged cross-sectional view showing a recessed portion of the semiconductor laser element.

Further, a recessed portion is formed on the stacked body 150. FIG. 7 is a cross-sectional view of the stacked body 150 showing the recessed portion and FIG. 8 is an enlarged view of FIG. 7. As shown in these figures, the surface of the p-type semiconductor layer 104, i.e., the outermost surface of crystal growth will be referred to as a surface S3. A recessed portion 150a that extends in a direction (Y direction) parallel to the ridge portion 121 is provided on the side of the stacked body 150 where the surface S3 and the side surface S1 are in contact with each other. The recessed portion 150a is dug down from the surface S3 and is formed to have a depth reaching the core 102c of the n-type semiconductor layer 102. The side surface S1 is not continuous with the surface S3 and is separated from the surface S3 by the recessed portion 150a. As shown in FIG. 8, a depth D1 of the recessed portion 150a is suitably 0.5 μm or more and 5 μm or less and a width W2 of the recessed portion 150a is suitably 1 μm or more and 50 μm or less.

Further, a recessed portion 150b that extends in a direction (Y direction) parallel to the ridge portion 121 is provided on the side of the stacked body 150 where the surface S3 and the side surface S2 are in contact with each other. The recessed portion 150b is dug down from the surface S3 and is formed to have a certain depth in the n-type semiconductor layer 102. The side surface S2 is not continuous with the surface S3 and is separated from the surface S3 by the recessed portion 150b. As shown in FIG. 8, a depth D2 of the recessed portion 150b is suitably 0.5 μm or more and 5 μm or less and a width W3 of the recessed portion 150b is suitably 1 μm or more and 50 μm or less. As shown in FIG. 4, the insulation layer 106 is formed on the inner peripheral surface of each of the recessed portion 150a and the recessed portion 150b.

Figure 9:
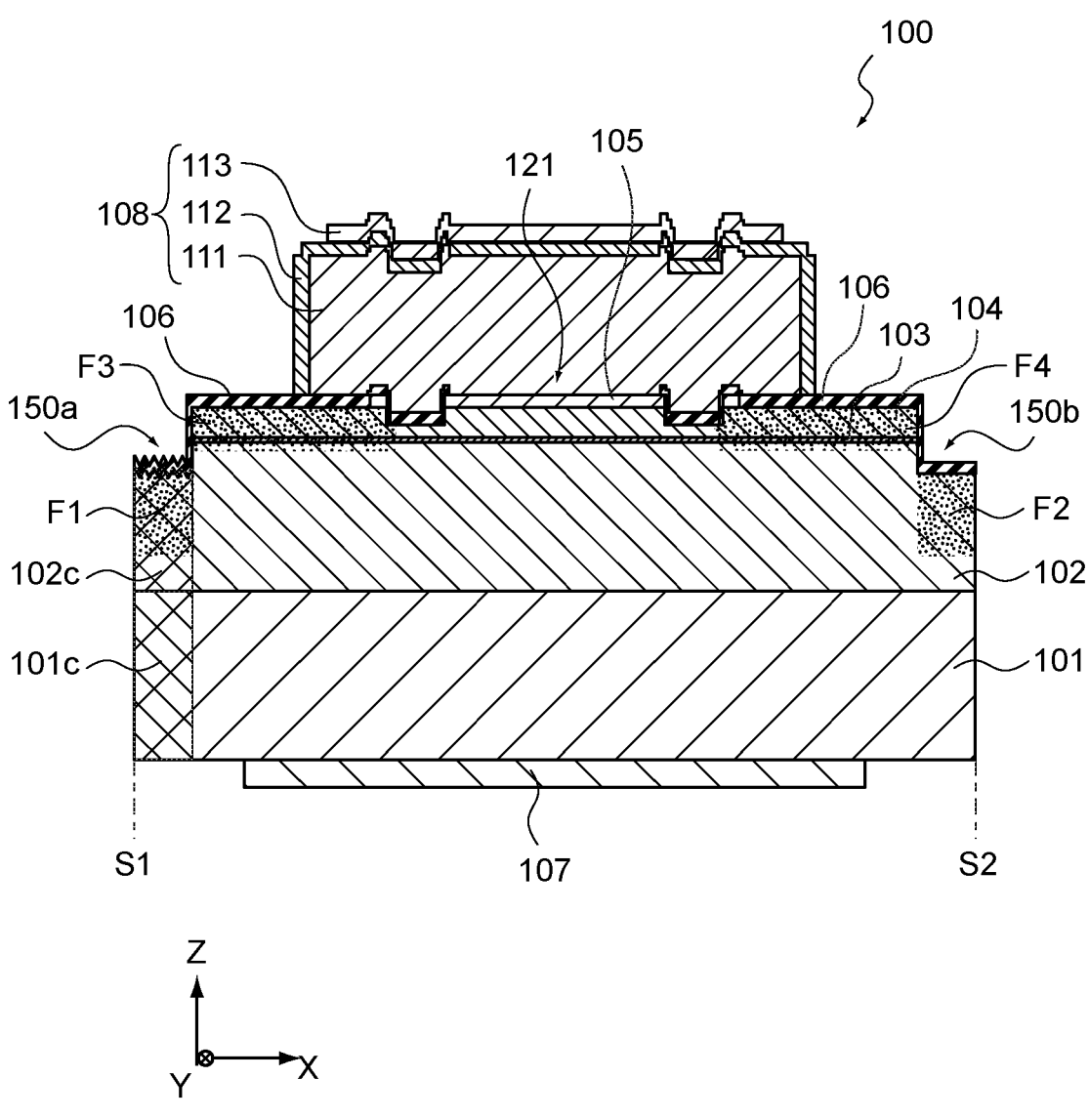
FIG. 9 is a cross-sectional view showing an ion implantation region of the semiconductor laser element.
Figure 10:
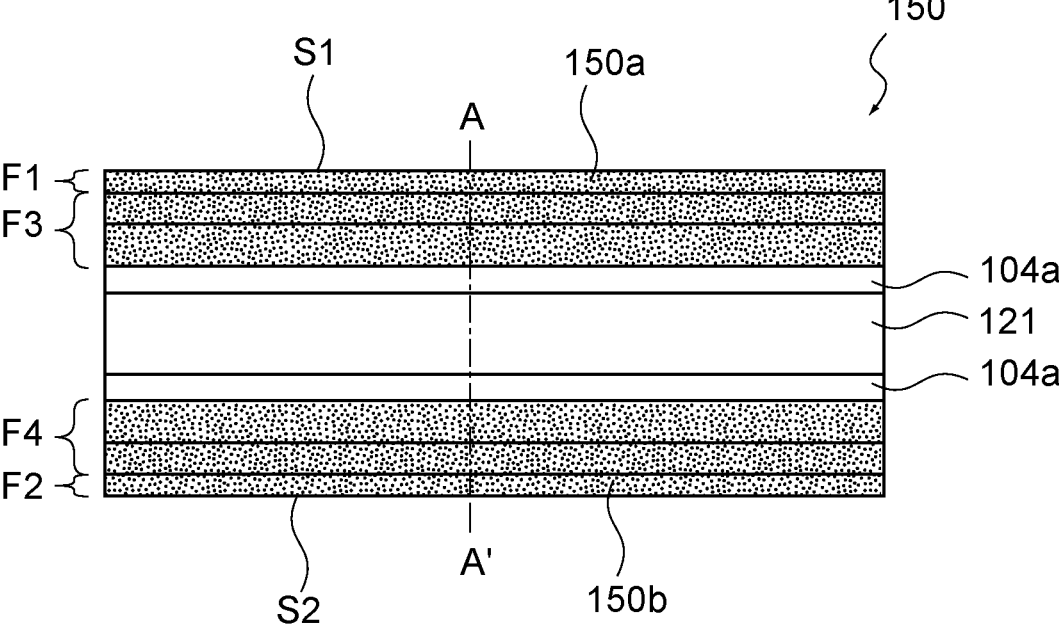
FIG. 10 is a plan view showing the ion implantation region of the semiconductor laser element.
Figure 10:
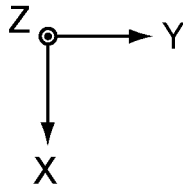

Further, an ion implantation region is provided in the stacked body 150. The ion implantation region is a region formed by implanting ions into a partial region of the stacked body 150. FIG. 9 is a cross-sectional view of the semiconductor laser element 100 showing the ion implantation region, and FIG. 10 is a plan view of the stacked body 150 showing the ion implantation region. FIG. 9 is a cross-sectional view taken along the line A-A' in FIG. 10. The ion implantation region is a region indicated by dots in FIG. 9 and FIG. 10 and includes ion implantation regions F1 to F4.

As shown in these figures, an ion implantation region F1 is formed in a region of the n-type semiconductor layer 102 including the core 102c in the vicinity of the side surface S1 to have a certain depth from the recessed portion 150a. Further, the ion implantation region F2 is formed in the n-type semiconductor layer 102 in the vicinity of the side surface S2 to have a certain depth from the recessed portion 150b.

Further, the ion implantation region F3 is formed between the ridge portion 121 and the ion implantation region F1 to have a certain depth in the n-type semiconductor layer 102 from the p-type semiconductor layer 104. Further, the ion implantation region F4 is formed between the ridge portion 121 and the ion implantation region F2 to have a certain depth in the n-type semiconductor layer 102 from the p-type semiconductor layer 104.

The ion implantation regions F1 to F4 are made have a high resistance by ion implantation. The ions forming the ion implantation regions F1 to F4 can be boron (B), nitrogen (N), or protons (H). The dose amount of ions in the ion implantation regions F1 to F4 can be, for example, $2\times10^{13}$ $cm^{-2}$ or more and $2\times10^{15}$ $cm^{-2}$ or less.

As described above, the ion implantation region F1 is formed to have a certain depth from the recessed portion 150a. Since the insulation layer 106 is formed on the inner peripheral surface of the recessed portion 150a as described above, the ion implantation region F1 exposed from the bottom surface of the recessed portion 150a is covered by the insulation layer 106.

The semiconductor laser element 100 has the configuration as described above. In the semiconductor laser element 100, when a voltage is applied between the n-electrode 107 and the p-electrode 108, the current flowing between the n-electrode 107 and the p-electrode 108 is concentrated on the ridge portion 121 and light emission (spontaneous emission light) occurs in a region of the active layer 103 located in the vicinity of the ridge portion 121. Reflecting mirrors (not shown) are provided at both ends of the semiconductor laser element 100 in the longitudinal direction to form a resonator. The spontaneous emission light is amplified while travelling through the waveguide formed by the ridge portion 121 and causes laser oscillation by the resonator.

[Effects of Semiconductor Laser Element]

Figure 11:
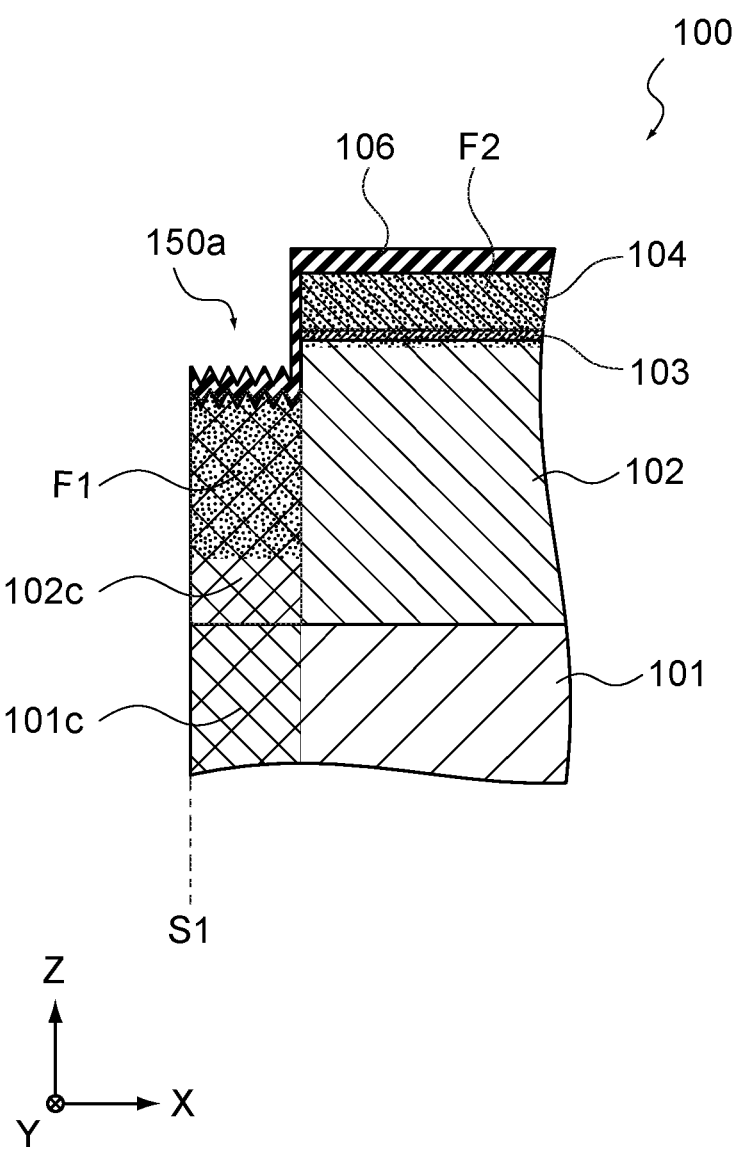
FIG. 11 is a cross-sectional view showing the recessed portion and the ion implantation region of the semiconductor laser element.

FIG. 11 is a cross-sectional view showing the vicinity of the core 102c. As shown in the figure, in the semiconductor laser element 100, the ion implantation region F1 is formed in a region of the n-type semiconductor layer 102 including the core 102c to increase the resistance. Although the insulation layer 106 is provided on the n-type semiconductor layer 102 in the recessed portion 150a, there is a possibility that the coverage of the insulation layer 106 is incomplete because the core 102c has variations in surface shape. However, since the ion implantation region F1 having a high resistance is provided below the insulation layer 106, the ion implantation region F1 provides insulation even if the insulation by the insulation layer 106 is insufficient.

In particular, in the case where the semiconductor laser element 100 mounted junction down, solder is applied between the p-electrode 108 and a mounting object to mount the semiconductor laser element 100. At this time, there is a possibility that the solder creeps up to the side surface S1 and the side surface S2 from the side of the p-electrode 108. Here, since the ion implantation region F1 is provided, current leakage due to the electrical connection between the solder and the n-type semiconductor layer 102 is prevented.

Further, in the semiconductor laser element 100, the recessed portion 150a and the recessed portion 150b are respective provided at the corners between the surface S3 (see FIG. 8) and the side surface S1 and between the surface S3 and the side surface S2. For this reason, when the semiconductor laser element 100 is mounted junction down, the solder surface is separated from the side surface S1 and the side surface S2 and the solder is less likely to creep up to the side surface S1 and the side surface S2. Therefore, by providing the recessed portion 150a and the recessed portion 150b, it is possible to more reliably prevent current leakage.

[Method of Producing Semiconductor Laser Element]

A method of producing the semiconductor laser element 100 will be described. FIG. 12 to FIG. 23 are each a schematic diagram showing a method of producing the semiconductor laser element 100.

Figure 12:
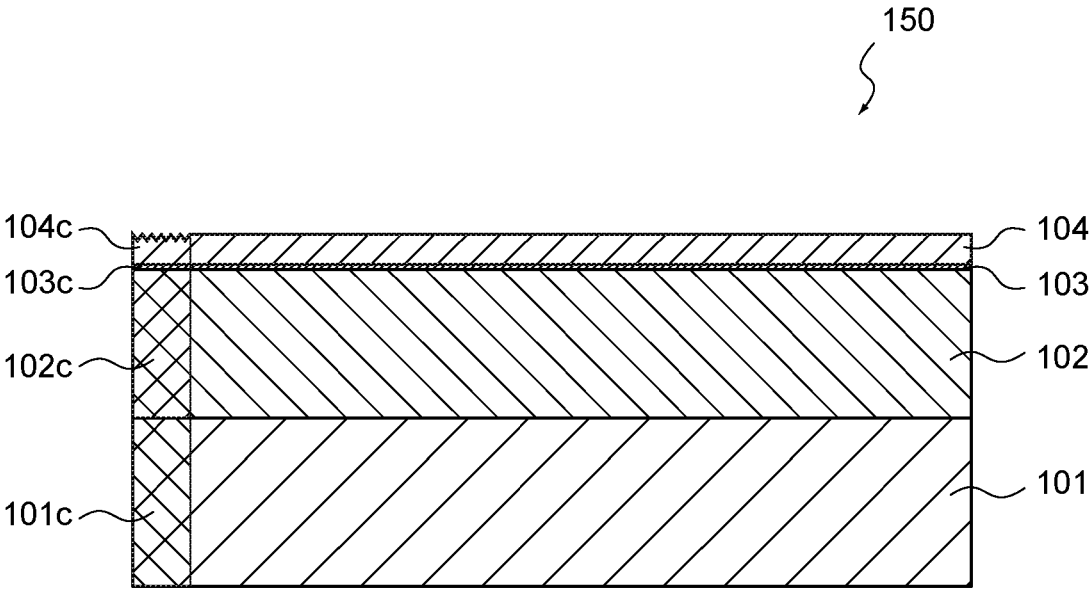
FIG. 12 is a cross-sectional view showing a method of producing the semiconductor laser element.

First, as shown in FIG. 12, the n-type semiconductor layer 102, the active layer 103, and the p-type semiconductor layer 104 are stacked on the substrate 101 to form the stacked body 150. These layers can be formed by growing crystals on the substrate 101 by a MOCVD (Metal Organic Chemical Vapor Deposition) method. Since the core 101c is present in the substrate 101, the core 102c, a 103c, and a core 104c inherit the crystal structure of the core 101c and are respectively formed in the n-type semiconductor layer 102, the active layer 103, and the p-type semiconductor layer 104.

Figure 13:
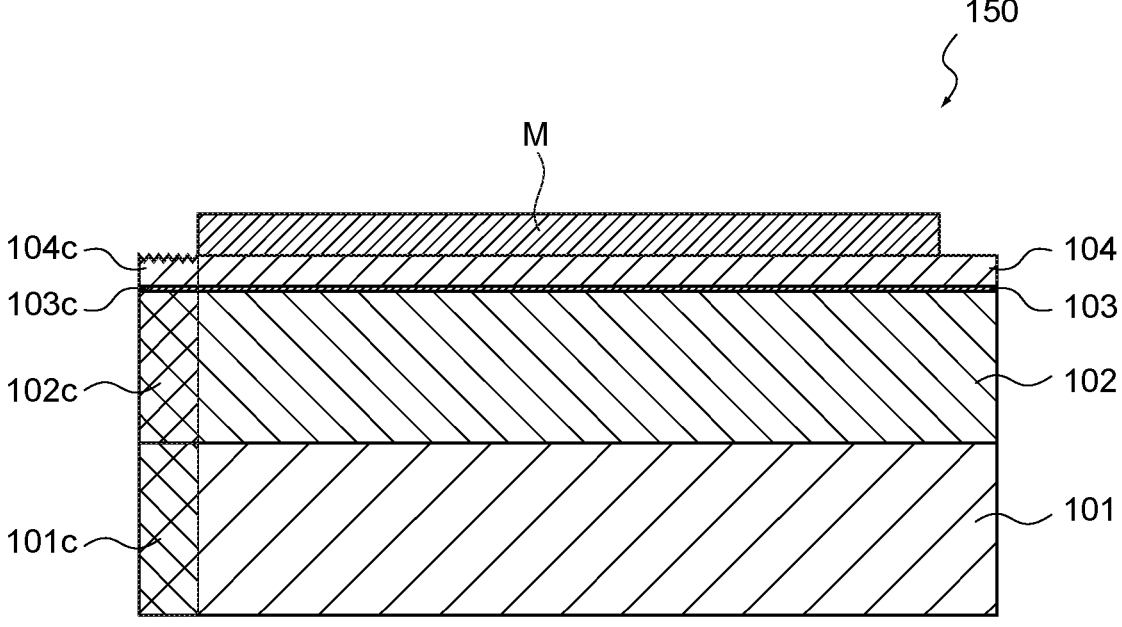
FIG. 13 is a cross-sectional view showing the method of producing the semiconductor laser element.
Figure 13:
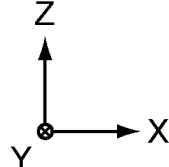

Subsequently, as shown in FIG. 13, an etching mask layer M is formed on the p-type semiconductor layer 104. The etching mask layer M is formed of, for example, SiO$_2$ or SiN and can be formed by a vapor deposition method, a sputtering method, or the like. As shown in FIG. 13, the etching mask layer M is patterned such that at least the core 104c is exposed. The etching mask layer M can be patterned by using, for example, photolithography to remove the etching mask layer M exposed from a resist opening by an RIE (Reactive Ion Etching) method using a fluorine-based gas or hydrofluoric acid-based wet etching.

Figure 14:
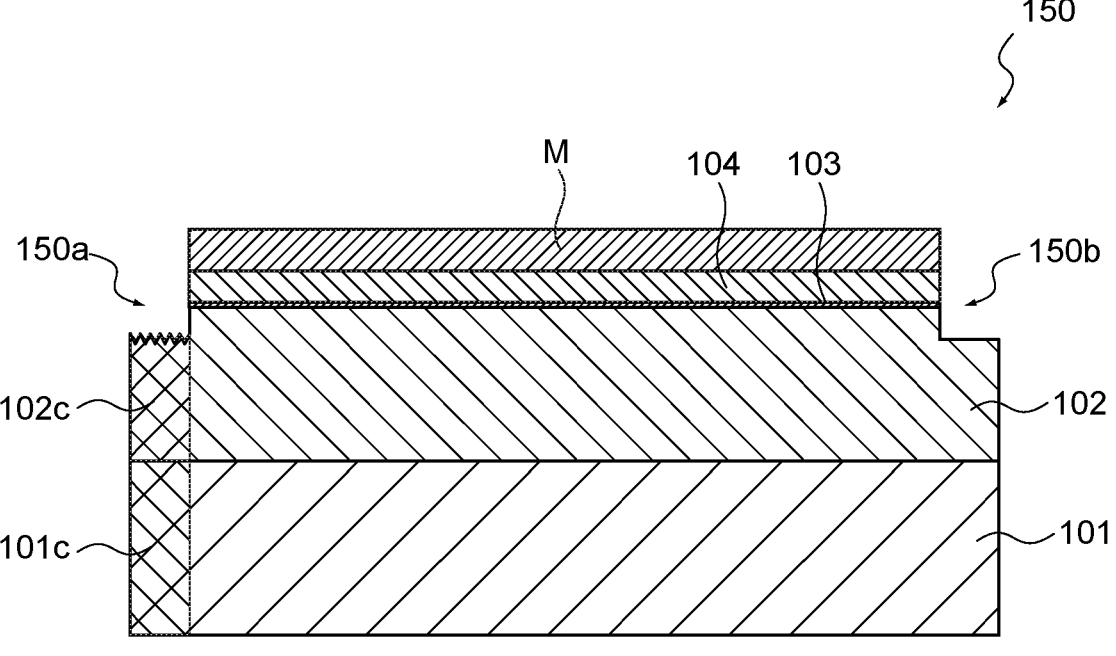
FIG. 14 is a cross-sectional view showing the method of producing the semiconductor laser element.
Figure 15:
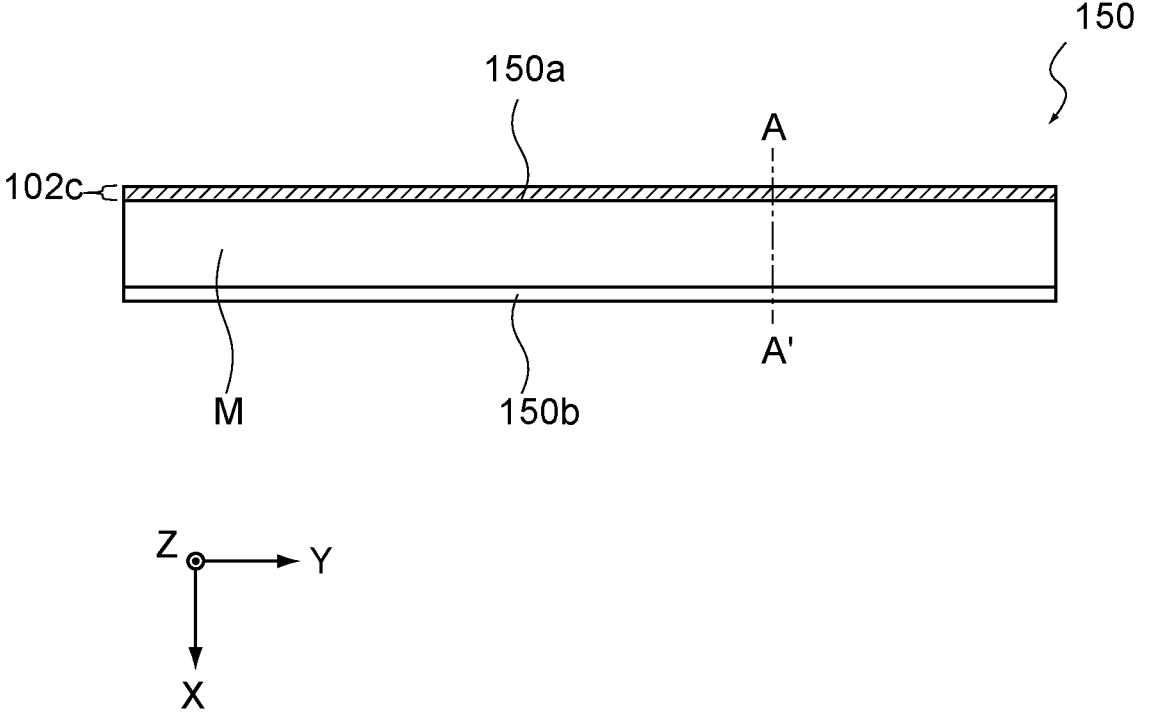
FIG. 15 is a plan view showing the method of producing the semiconductor laser element.

Subsequently, as shown in FIG. 14, the p-type semiconductor layer 104, the active layer 103, and the n-type semiconductor layer 102 are etched using the etching mask layer M to form the recessed portion 150a and the recessed portion 150b. This etching can be performed by the RIE using a chlorine-based gas. FIG. 15 is a plan view of the stacked body 150 in the state up to this point and FIG. 14 is a cross-sectional view taken along the line A-A' in FIG. 15. In FIG. 15 and the following plan views, the range in which the core 102c is formed is indicated by a shaded region.

Figure 16:
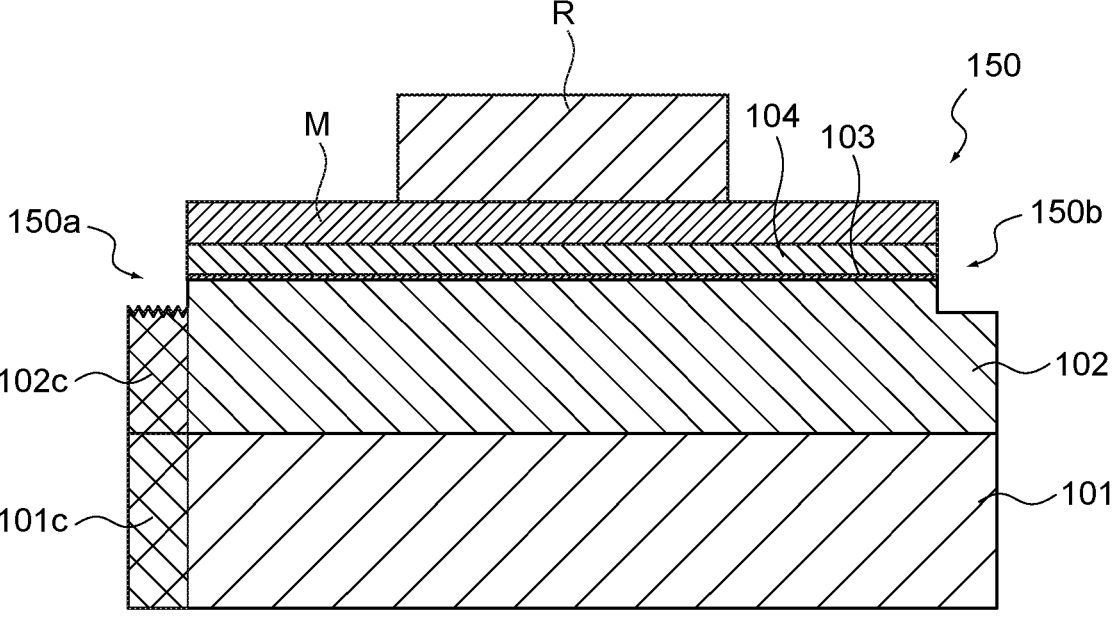
FIG. 16 is a cross-sectional view showing the method of producing the semiconductor laser element.
Figure 16:
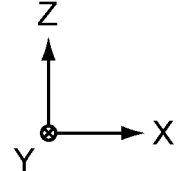
Figure 17:
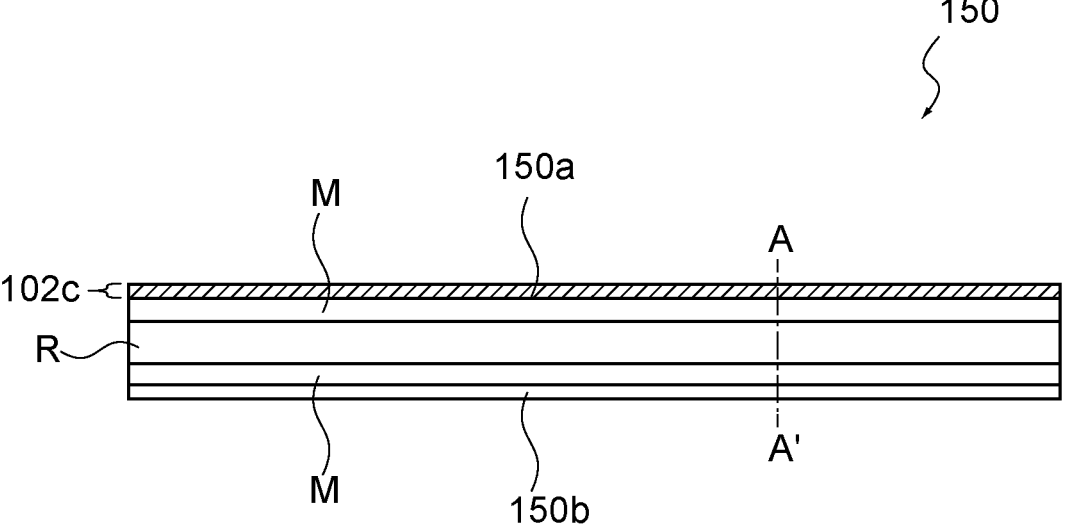
FIG. 17 is a plan view showing the method of producing the semiconductor laser element.
Figure 17:
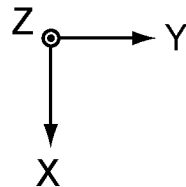

Subsequently, as shown in FIG. 16, a resist R is stacked on the etching mask layer M. The resist R is patterned so as to cover a portion that serves as the ridge portion 121 (see FIG. 2). The resist R can be patterned using photolithography. FIG. 17 is a plan view showing the stacked body 150 in the state up to this point and FIG. 16 is a cross-sectional view taken along the line A-A' in FIG. 17.

Figure 18:
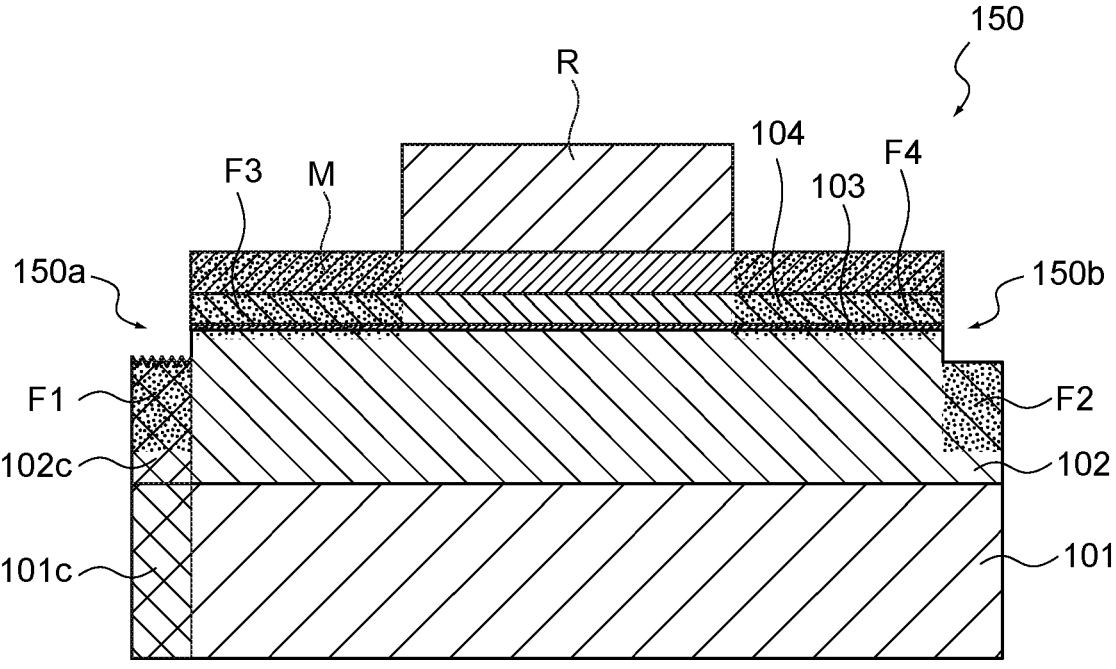
FIG. 18 is a cross-sectional view showing the method of producing the semiconductor laser element.
Figure 18:
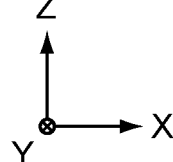

Subsequently, as shown in FIG. 18, ion implantation is performed on the stacked body 150 from above the resist R to form the ion implantation regions F1 to F4. The ions to be implanted are boron (B), nitrogen (N), protons (H), or the like, the implantation energy is suitably, for example, 40 keV or more and 160 keV or less, and the dose amount is suitably, for example, $2 \times 10^{13}$ cm$^{-2}$ or more and $2 \times 10^{15}$ cm$^{-2}$ or less. In order to make the concentration of ion implantation uniform in the depth direction, the implantation energy may be changed to perform ion implantation twice. In this case, the implantation energy can be 65 keV and 140 keV and the dose amount can be $6 \times 10^{14}$ cm$^{-2}$.

Figure 19:
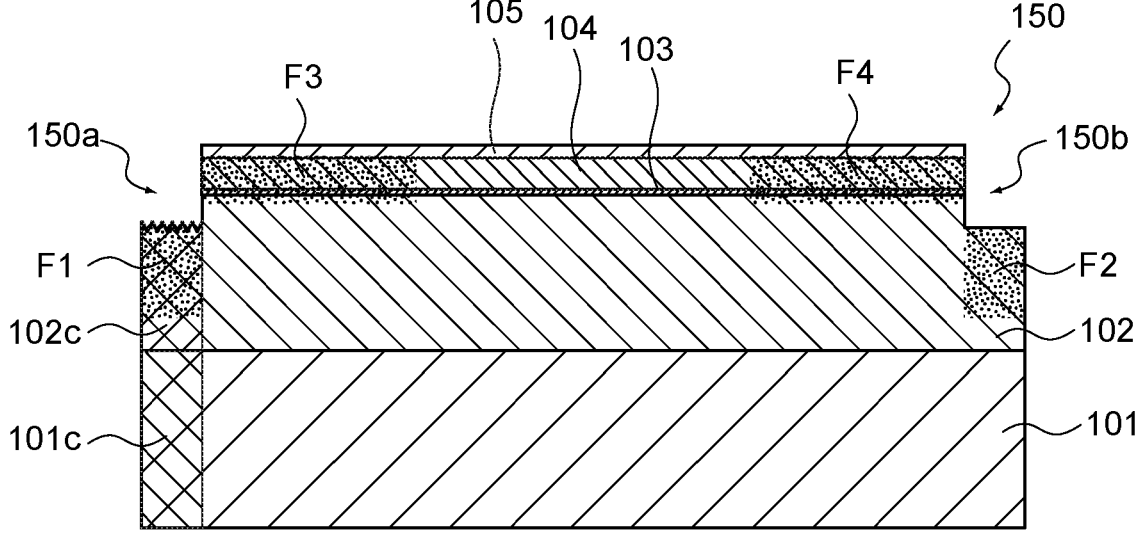
FIG. 19 is a cross-sectional view showing the method of producing the semiconductor laser element.
Figure 19:
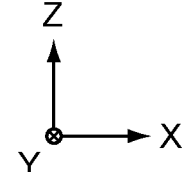

Subsequently, the resist R and the etching mask layer M are removed. The resist R can be removed by ashing or an organic solvent and the etching mask layer M can be removed by hydrofluoric acid-based wet etching. Subsequently, as shown in FIG. 19, the transparent conductive film 105 is formed on the p-type semiconductor layer 104. The transparent conductive film 105 is formed by a vapor deposition method, a sputtering method, or the like.

Figure 20:
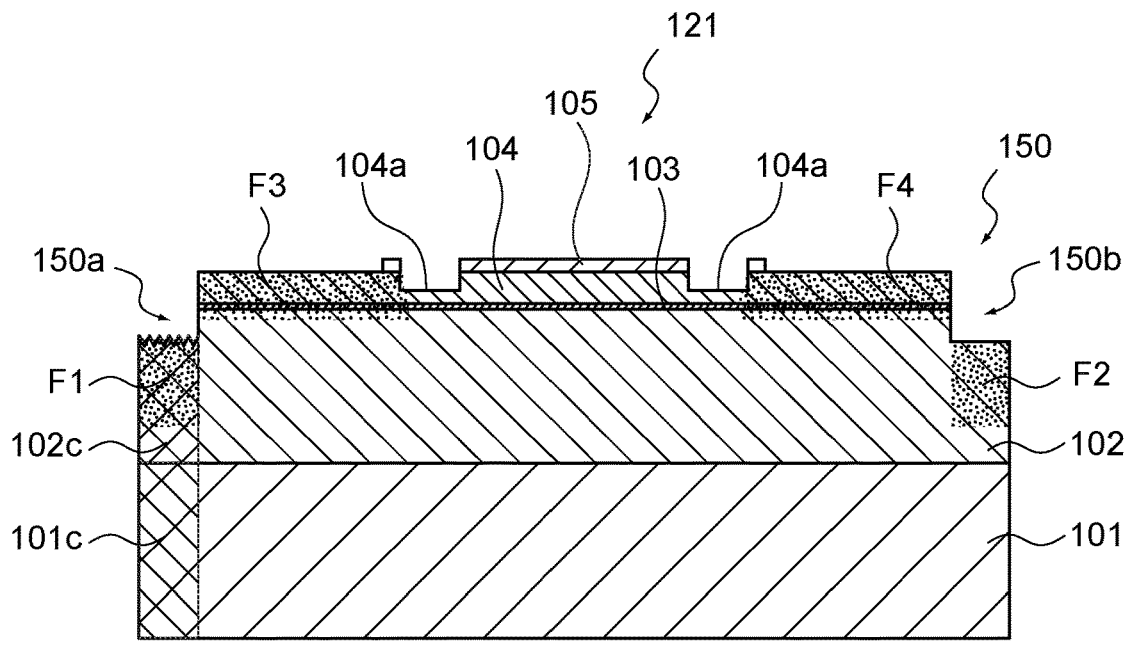
FIG. 20 is a cross-sectional view showing the method of producing the semiconductor laser element.
Figure 21:
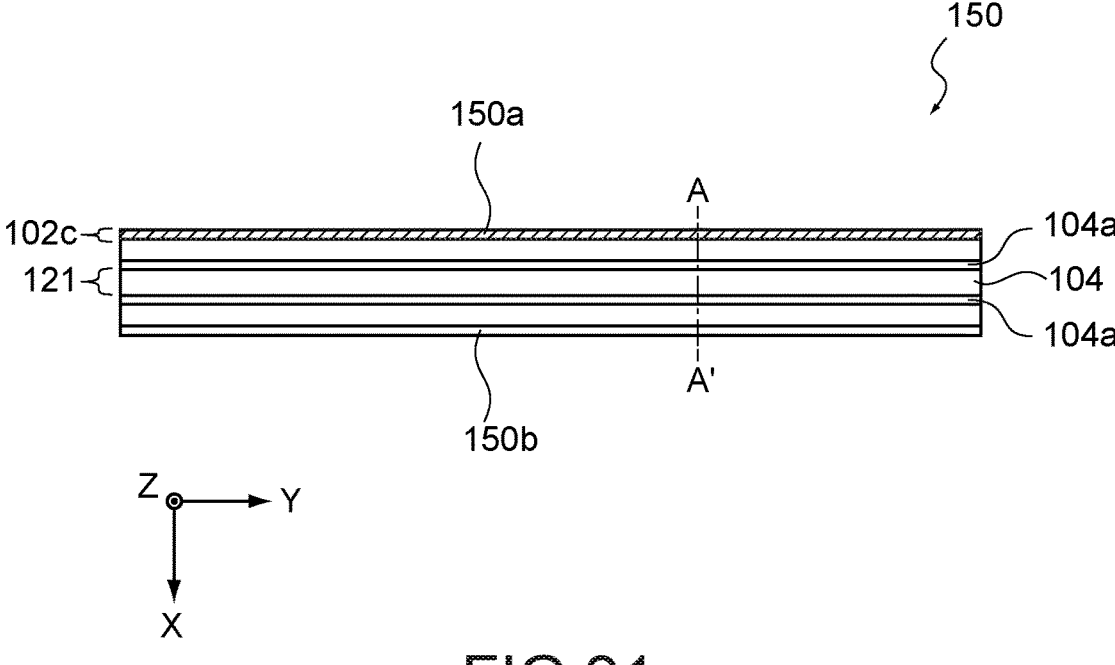
FIG. 21 is a plan view showing the method of producing the semiconductor laser element.

Subsequently, as shown in FIG. 20, the transparent conductive film 105 and the p-type semiconductor layer 104 are partially removed to form the ridge portion 121. The transparent conductive film 105 and the p-type semiconductor layer 104 can be removed by the RIE using a mask patterned by photolithography. FIG. 21 is a plan view showing the stacked body 150 and the transparent conductive film 105 in the state up to this point, and FIG. 20 is a cross-sectional view taken along the line A-A' in FIG. 21.

Figure 22:
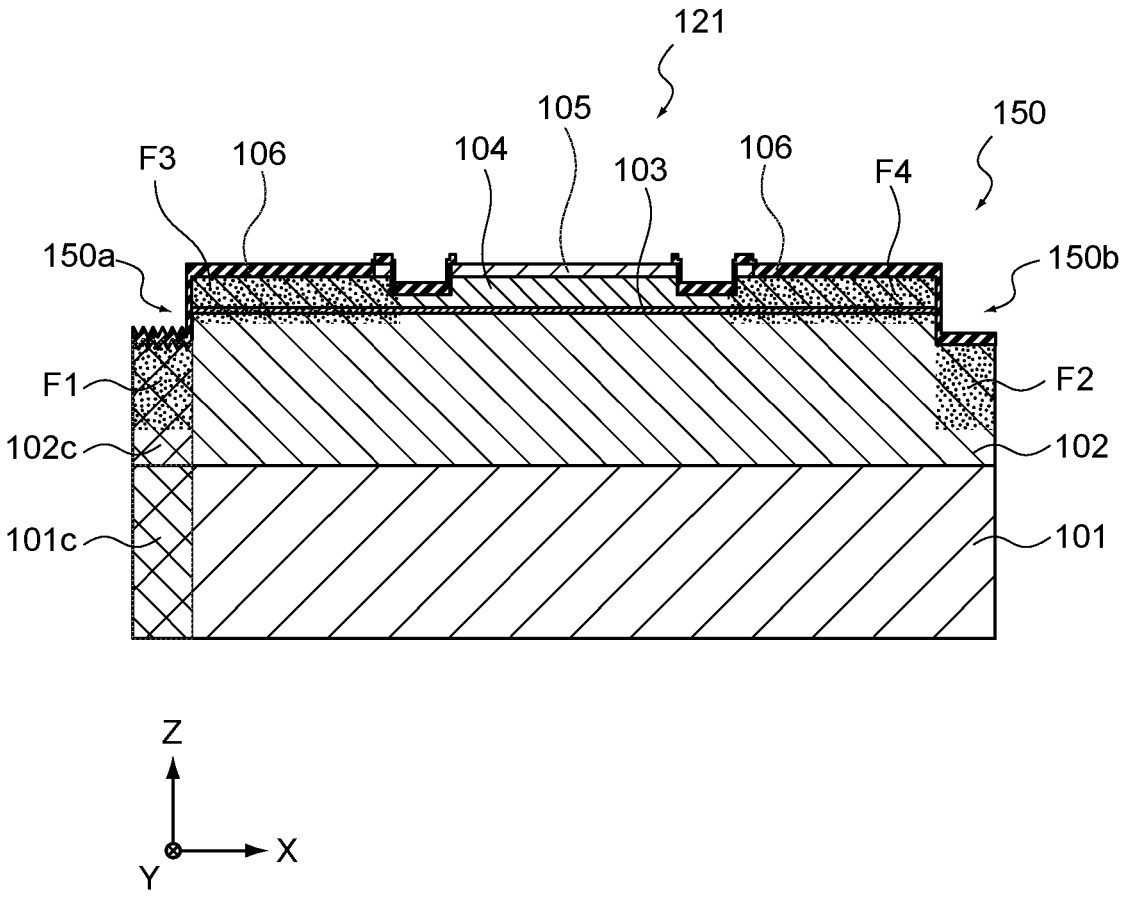
FIG. 22 is a plan view showing the method of producing the semiconductor laser element.

Subsequently, as shown in FIG. 22, the insulation layer 106 is formed on the p-type semiconductor layer 104 and the n-type semiconductor layer 102 except for the ridge portion 121. The insulation layer 106 can be formed by being uniformly deposited on the transparent conductive film 105, the p-type semiconductor layer 104, and the n-type semiconductor layer 102 by a vapor deposition method, a sputtering method, or the like and then removing only the portion on the ridge portion 121. The insulation layer 106 can be removed by the RIE method or hydrofluoric acid-based wet etching using a mask patterned by photolithography.

Figure 23:
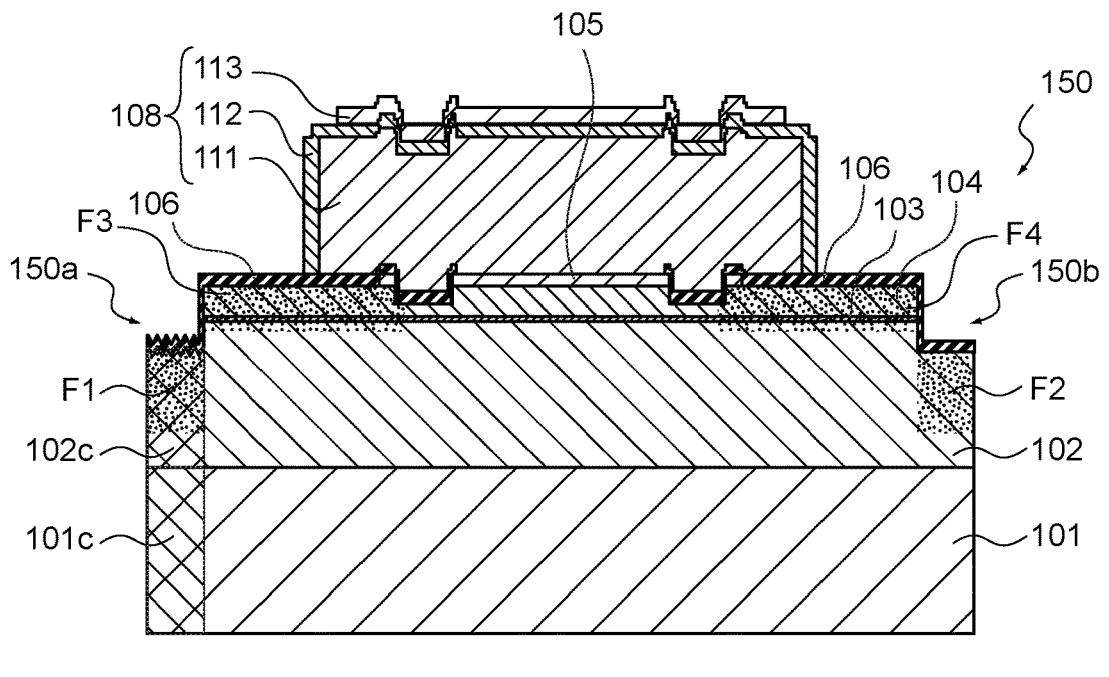
FIG. 23 is a cross-sectional view showing the method of producing the semiconductor laser element.
Figure 23:
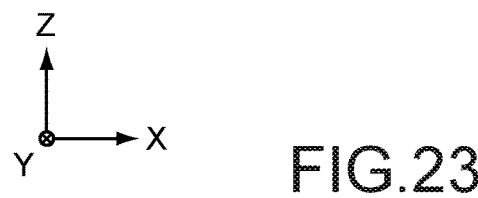

Subsequently, as shown in FIG. 23, the pad metal layer 111, the barrier metal layer 112, and the bonding metal layer 113 are sequentially stacked on the transparent conductive film 105 and the insulation layer 106. These metal layers can be formed by being deposited by a vapor deposition method, a sputtering method, or the like and patterned by a lift-off method or the like. The patterning may be performed by removing an unnecessary portion by the RIE or a milling method. Next, the substrate 101 is polished to have a film thickness suitable for cleavage to form the n-electrode 107 (see FIG. 1). The n-electrode 107 can be formed by being patterned by a lift-off method or the like.

Subsequently, the substrate 101 is cleaved into a bar shape and the exposed end surface portion is coated. Further, the bar is cut into a chip to prepare the semiconductor laser element 100. The semiconductor laser element 100 can be produced in this way.

Modified Example 1

Figure 24:
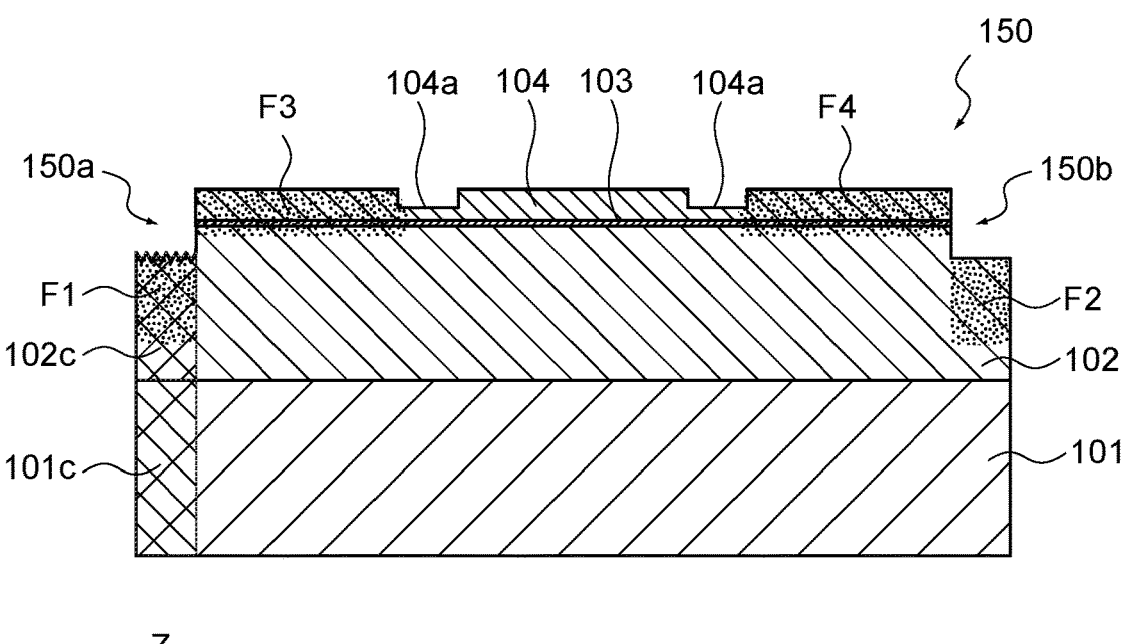
FIG. 24 is a cross-sectional view of a semiconductor laser element according to a modified example 1 of the present technology.
Figure 24:
Figure 25:
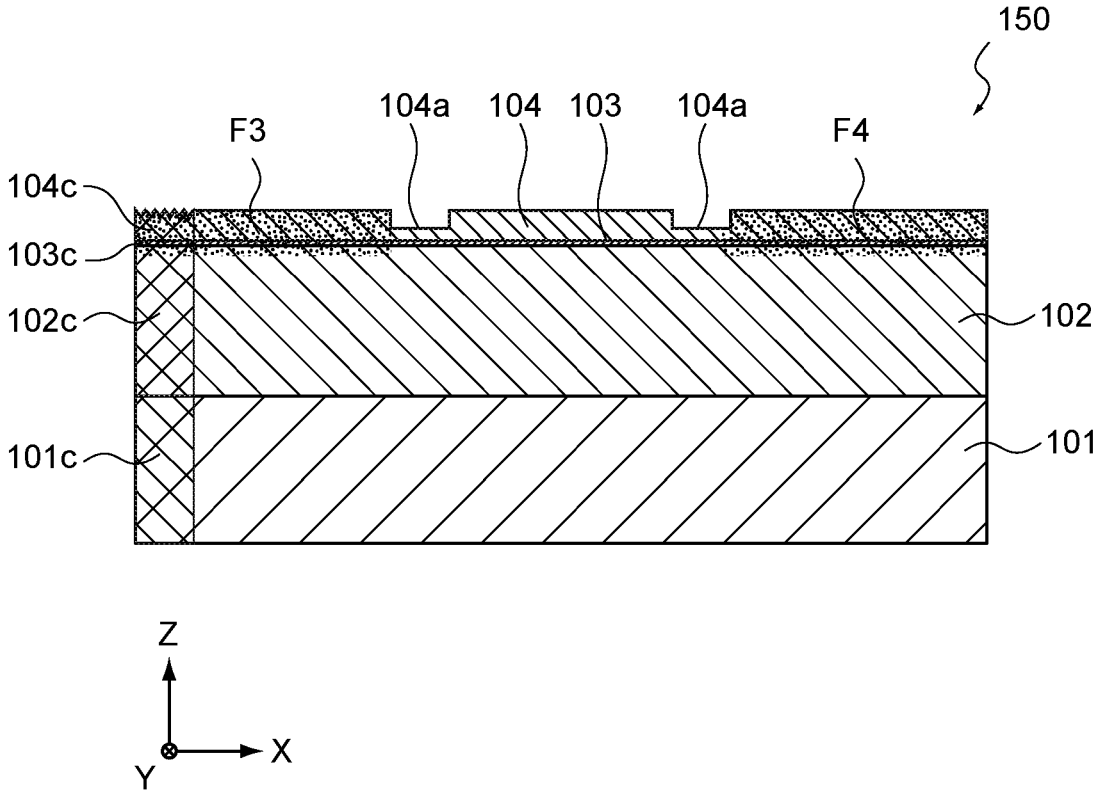
FIG. 25 is a cross-sectional view of the semiconductor laser element according to the modified example 1 of the present technology.
Figure 26:
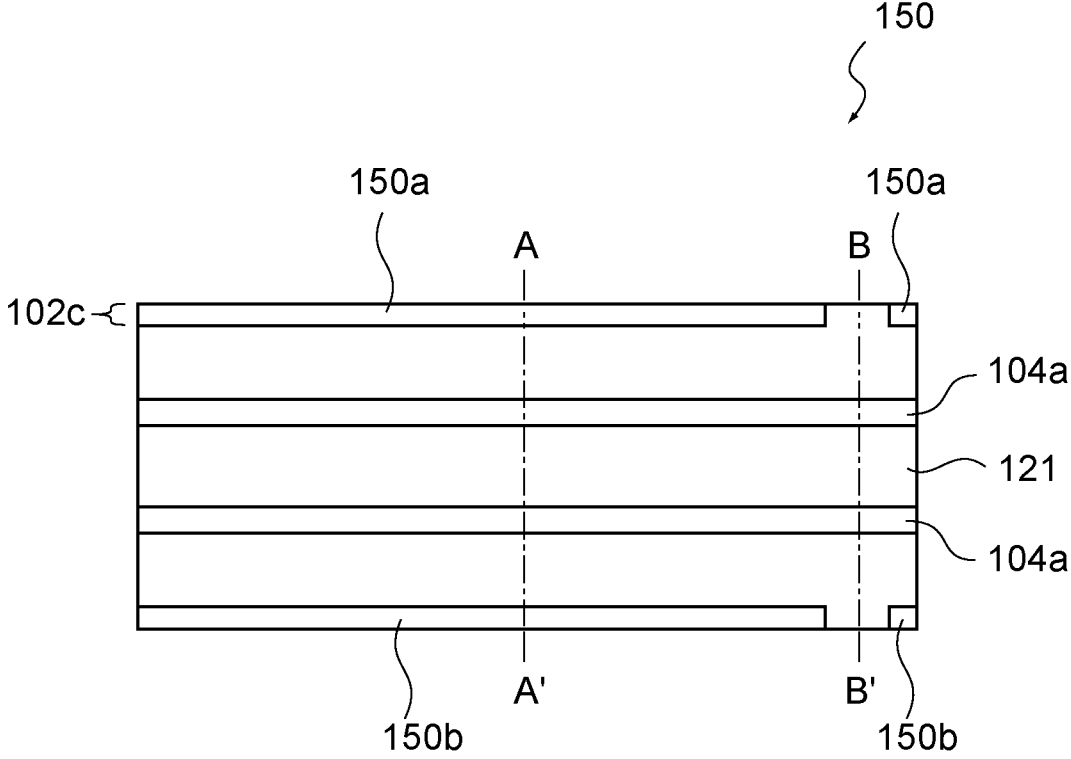
FIG. 26 is a plan view of the semiconductor laser element according to the modified example 1 of the present technology.
Figure 26:
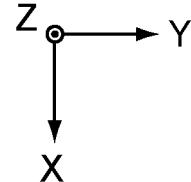

The semiconductor laser element 100 according to a modified example 1 of the present technology will be described. FIG. 24 and FIG. 25 are each a cross-sectional view of the stacked body 150 of the semiconductor laser element 100 according to the modified example 1. FIG. 26 is a plan view of the stacked body 150 of the semiconductor laser element 100 according to the modified example 1. FIG. 24 is a cross-sectional view taken along the line A-A' in FIG. 26, and FIG. 25 is a cross-sectional view taken along the line B-B' in FIG. 26. Although the recessed portion 150a and the recessed portion 150b are formed in the cross section shown in FIG. 24, the recessed portion 150a and the recessed portion 150b are not formed in the cross section shown in FIG. 25. Thus, the recessed portion 150a and the recessed portion 150b do not necessarily need to be continuous in the extending direction (Y direction) of the ridge portion 121, and a region where the recessed portion 150a and the recessed portion 150b are not provided may be provided.

Modified Example 2

Figure 27:
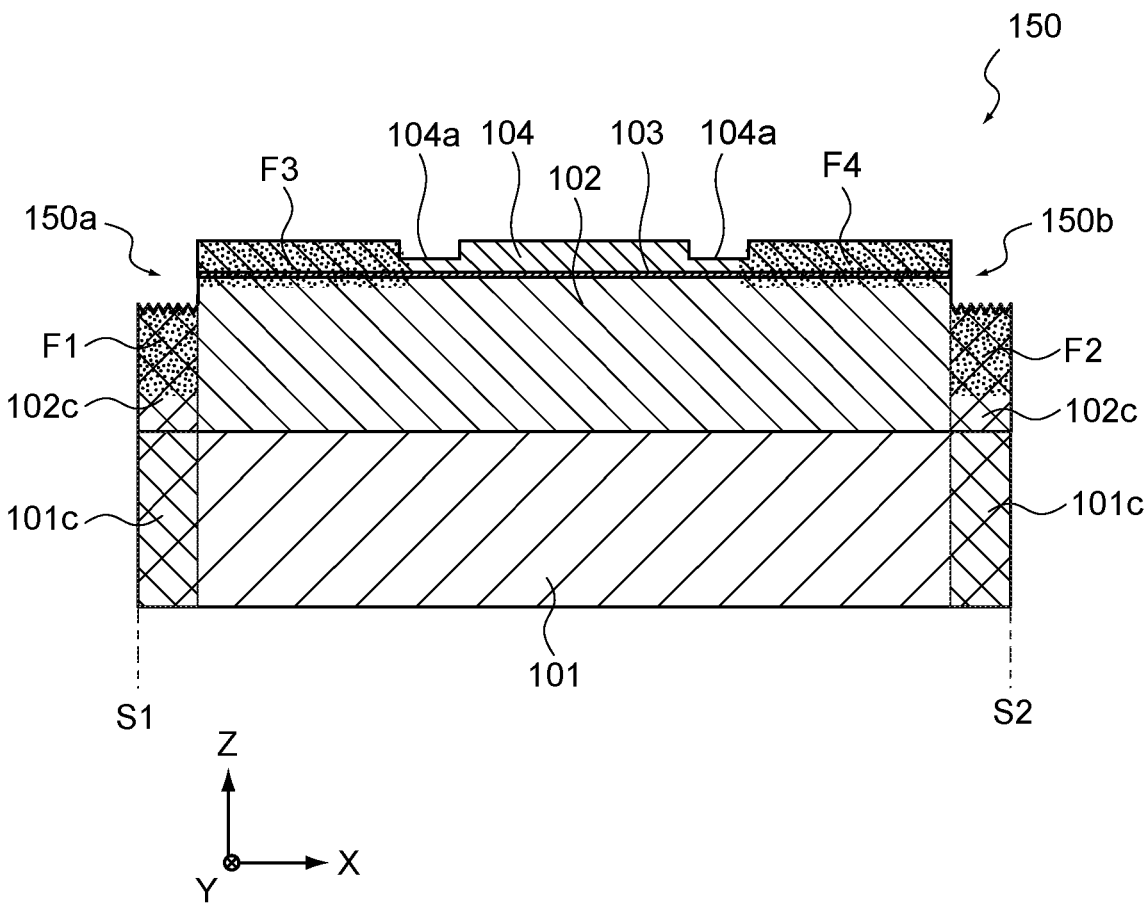
FIG. 27 is a cross-sectional view of a semiconductor laser element according to a modified example 2 of the present technology.
Figure 28:
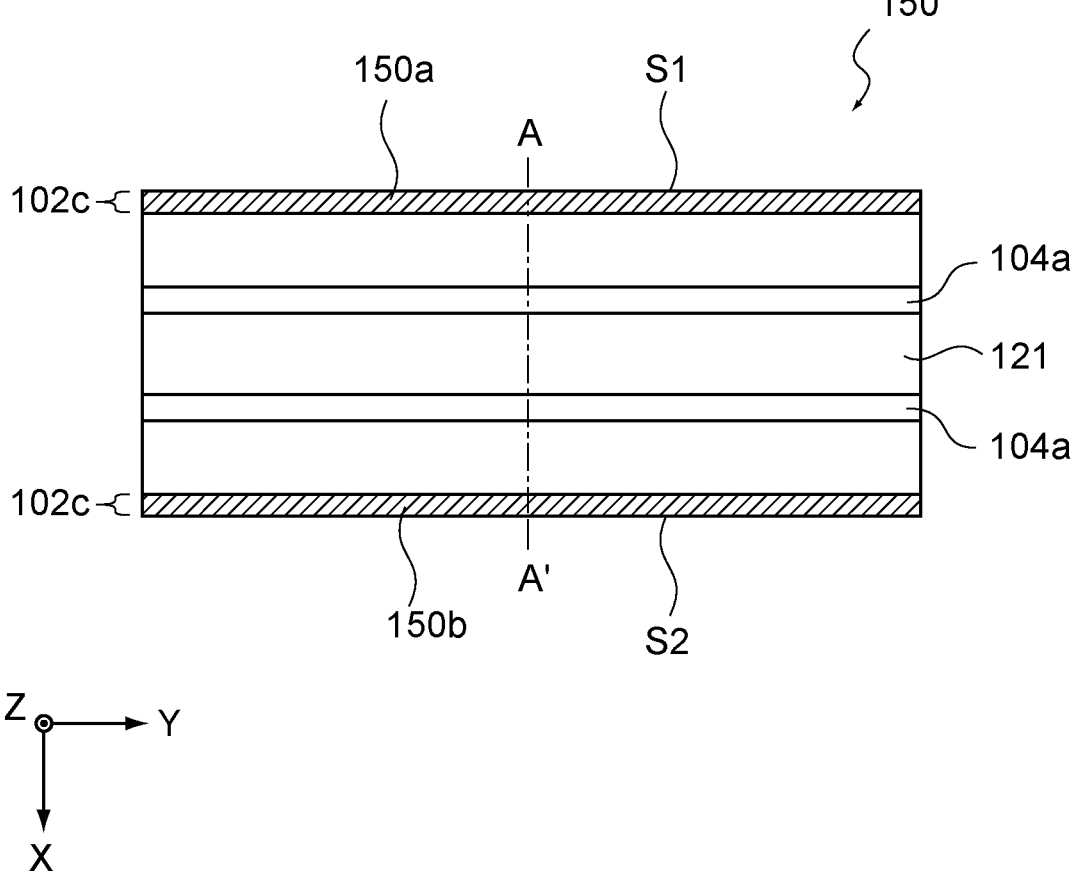
FIG. 28 is a plan view of the semiconductor laser element according to the modified example 2 of the present technology.

The semiconductor laser element 100 according to a modified example 2 of the present technology will be described. FIG. 27 is a cross-sectional view of the stacked body 150 of the semiconductor laser element 100 according to the modified example 2. FIG. 28 is a plan view of the stacked body 150 of the semiconductor laser element 100 according to the modified example 2. FIG. 27 is a cross-sectional view taken along the line A-A' in FIG. 28. As shown in these figures, the core 101c and the core 102c may be formed not only in the vicinity of the side surface S1 but also in the vicinity of the side surface S2.

It should be noted that the present technology may also take the following configurations.

(1) A semiconductor laser element, including:

a stacked body that includes a substrate, an n-type semiconductor layer that is formed on the substrate, is formed of an n-type semiconductor material, and has a core that is a defect concentration region, an active layer that is formed on the n-type semiconductor layer, and a p-type semiconductor layer that is formed on the active layer and is formed of a p-type semiconductor material, and has a recessed portion formed from a surface of the p-type semiconductor layer to have a depth reaching the core and an ion implantation region that is formed by implanting ions into a region including the core.

(2) The semiconductor laser element according to (1) above, in which the stacked body has a side surface including an end surface of the n-type semiconductor layer, the core is exposed to the side surface, and the recessed portion is provided between the surface and the side surface to separate the side surface from the surface.

(3) The semiconductor laser element according to (1) or (2) above, in which a ridge portion that extends in a direction parallel to the surface is provided in the p-type semiconductor layer, and the recessed portion may extend in a direction parallel to the ridge portion.

(4) The semiconductor laser element according to any one of (1) to (3) above, further including an insulation layer formed on the surface and an inner peripheral surface of the recessed portion, in which the ion implantation region is covered by the insulation layer.

(5) The semiconductor laser element according to any one of (1) to (4) above, in which the substrate is a c-plane GaN substrate, the c-plane GaN substrate being a substrate that is formed of n-type GaN and has a main surface parallel to a c-plane of a GaN crystal, and the n-type semiconductor layer, the active layer, and the p-type semiconductor layer are formed by crystal growth on the c-plane GaN substrate.

(6) The semiconductor laser element according to any one of (1) to (5) above, in which the ions are boron ions, nitrogen ions, or protons, and a dose amount of the ions is $2 \times 10^{13}$ cm$^{-2}$ or more and $2 \times 10^{15}$ cm$^{-2}$ or less.

(7) A method of producing a semiconductor laser element, including:

preparing a stacked body that includes a substrate, an n-type semiconductor layer that is formed on the substrate, is formed of an n-type semiconductor material, and has a core that is a defect concentration region, an active layer that is formed on the n-type semiconductor layer, and a p-type semiconductor layer that is formed on the active layer and is formed of a p-type semiconductor material;

forming, by etching, a recessed portion formed from a surface of the p-type semiconductor layer to have a depth reaching the core; and Implanting ions into a region of the stacked body including the core.

REFERENCE SIGNS LIST

100 semiconductor laser element
101 substrate
101c core
102 n-type semiconductor layer
103 active layer
104 p-type semiconductor layer
105 transparent conductive film
106 insulation layer
107 n-electrode
108 p-electrode
121 ridge portion
150 stacked body
150a recessed portion
150b recessed portion

The invention claimed is:

1. A semiconductor laser element, comprising:
a stacked body that includes:
a substrate;
an n-type semiconductor layer on the substrate, wherein
the n-type semiconductor layer comprises an n-type semiconductor material,
the n-type semiconductor layer has a core, and
the core is a defect concentration region,
an active layer on the n-type semiconductor layer;
a p-type semiconductor layer on the active layer, wherein
the p-type semiconductor layer comprises a p-type semiconductor material, the p-type semiconductor layer has a recessed portion above the core, the recessed portion has a depth from a surface of the p-type semiconductor layer to the core of the n-type semiconductor layer, and the core excludes the recessed portion; and an ion implantation region having ions, wherein the ion implantation region has a specific depth from the recessed portion.

2. The semiconductor laser element according to claim 1, wherein the stacked body has a side surface including an end surface of the n-type semiconductor layer, the core is in contact with the side surface, and the recessed portion is between the surface of the p-type semiconductor layer and the side surface to separate the side surface from the surface of the p-type semiconductor layer.

3. The semiconductor laser element according to claim 2, wherein the p-type semiconductor layer comprises a ridge portion, the ridge portion extends in a direction parallel to the surface of the p-type semiconductor layer, and the recessed portion extends in a direction parallel to the ridge portion.

4. The semiconductor laser element according to claim 1, further comprising an insulation layer on the surface of the p-type semiconductor layer and an inner peripheral surface of the recessed portion, wherein the insulation layer covers the ion implantation region.

5. The semiconductor laser element according to claim 1, wherein the substrate is a c-plane Gallium Nitride (GaN) substrate, the c-plane GaN substrate comprises a n-type GaN, the c-plane GaN substrate has a main surface parallel to a c-plane of a GaN crystal, and the n-type semiconductor layer, the active layer, and the p-type semiconductor layer are associated with a crystal growth on the c-plane GaN substrate.

6. The semiconductor laser element according to claim 1, wherein the ions are one of boron ions, nitrogen ions, or protons, and a dose amount of the ions is one of equal to or greater than $2 \times 10^{13}$ cm$^{-2}$ and one of less than or equal to $2 \times 10^{15}$ cm$^{-2}$.

7. A method of producing a semiconductor laser element, the method comprising:

preparing a stacked body that includes:

a substrate, an n-type semiconductor layer on the substrate, wherein the n-type semiconductor layer comprises an n-type semiconductor material, the n-type semiconductor layer has a core, and the core is a defect concentration region, an active layer on the n-type semiconductor layer, and a p-type semiconductor layer on the active layer, wherein the p-type semiconductor layer comprises a p-type semiconductor material;

forming, by etching, a recessed portion that has a depth from a surface of the p-type semiconductor layer to the core of the n-type semiconductor layer, wherein the core excludes the recessed portion; and implanting ions into a region of the stacked body including the core to form an ion implantation region, wherein the ion implantation region has a specific depth from the recessed portion.

\* \* \* \* \*